(12) United States Patent
Fabretti et al.

(10) Patent No.: US 12,465,074 B2
(45) Date of Patent: Nov. 11, 2025

(54) SYSTEMS AND METHODS FOR ROASTING COFFEE BEANS

(71) Applicant: DIVERSIFIED LASER TECHNOLOGIES, LLC, Sandpoint, ID (US)

(72) Inventors: JR Fabretti, Byron, NY (US); Scott Plail, Sandpoint, ID (US)

(73) Assignee: DIVERSIFIED LASER TECHNOLOGIES, LLC, Sandpoint, ID (US)

( * ) Notice: Subject to any disclaimer, the term of this patent is extended or adjusted under 35 U.S.C. 154(b) by 921 days.

(21) Appl. No.: 17/531,634

(22) Filed: Nov. 19, 2021

(65) Prior Publication Data

US 2022/0079206 A1 Mar. 17, 2022

Related U.S. Application Data

(63) Continuation-in-part of application No. PCT/US2020/034398, filed on May 22, 2020.
(Continued)

(51) Int. Cl.
- *A23N 12/12* (2006.01)
- *A23F 5/04* (2006.01)
(Continued)

(52) U.S. Cl.
CPC .............. *A23N 12/125* (2013.01); *A23F 5/04* (2013.01); *A23F 5/10* (2013.01); *A23F 5/243* (2013.01);
(Continued)

(58) Field of Classification Search
CPC ... A23F 5/04; A23F 5/10; A23F 5/243; A23G 1/0006; A23G 1/002; A23N 12/08;
(Continued)

(56) References Cited

U.S. PATENT DOCUMENTS

| 2,415,307 A | 2/1947 | Richeson |
| 3,841,826 A | 10/1974 | Angstadt |
(Continued)

FOREIGN PATENT DOCUMENTS

| BR | 112021023334 A2 | 1/2022 |
| CA | 3139528 A1 | 11/2020 |
(Continued)

OTHER PUBLICATIONS

Communication pursuant to Article 94(3) EPC in EP Application No. 20 809 440.9-1105 mailed Sep. 30, 2024 (21 pgs).
(Continued)

*Primary Examiner* — Chris Q Liu
*Assistant Examiner* — James F Sims, III
(74) *Attorney, Agent, or Firm* — Nixon Peabody LLP

(57) ABSTRACT

A system for heating an object includes an electromagnetic radiation source emitting electromagnetic radiation, a first stage, a second stage, and a third stage. The object is placed into the first stage where it is struck by electromagnetic radiation to thereby heat the object. The object is then transported to the second stage which has a cooling fluid flowing therein. The object moves through the second stage to cool down subsequent to being struck by the electromagnetic radiation. Air and any particulate matter produced by the electromagnetic radiation striking the object in the first stage is transported to the third stage. In the third stage, electromagnetic radiation is used to incinerate some of the particulate matter. The air in the third stage is vented out of the third stage through a filter.

39 Claims, 24 Drawing Sheets

Related U.S. Application Data

(60) Provisional application No. 62/851,458, filed on May 22, 2019.

(51) Int. Cl.

| | | |
|---|---|---|
| *A23F 5/10* | (2006.01) | |
| *A23F 5/24* | (2006.01) | |
| *A23N 12/10* | (2006.01) | |
| *F25B 17/00* | (2006.01) | |
| *F28D 21/00* | (2006.01) | |
| *G02B 26/08* | (2006.01) | |
| *H02S 40/22* | (2014.01) | |

(52) U.S. Cl.
CPC ......... *A23N 12/10* (2013.01); *G02B 26/0816* (2013.01); *F25B 17/00* (2013.01); *F28D 2021/0042* (2013.01); *H02S 40/22* (2014.12)

(58) Field of Classification Search
CPC ....... A23N 12/10; A23N 12/125; F25B 17/00; F28D 2021/0042; G02B 26/0816; H02S 40/22; Y02A 40/924; Y02E 10/50
USPC ......................................................... 99/286
See application file for complete search history.

(56) References Cited

U.S. PATENT DOCUMENTS

| | | |
|---|---|---|
| 4,326,114 A | 4/1982 | Gerling et al. |
| 4,780,586 A | 10/1988 | Le Viet et al. |
| 5,016,362 A | 5/1991 | Nakamura |
| 5,638,607 A | 6/1997 | Lemme et al. |
| 6,000,144 A | 12/1999 | Bussmann |
| 6,104,494 A | 8/2000 | Torbet et al. |
| 6,106,877 A | 8/2000 | Allington et al. |
| 6,260,479 B1 | 7/2001 | Friedrich et al. |
| 7,285,300 B1 | 10/2007 | Allington et al. |
| 10,213,047 B2 | 2/2019 | Boggabarapu |
| 2004/0121055 A1 | 6/2004 | Musicco |
| 2014/0076167 A1 | 3/2014 | Boggabarapu |
| 2014/0370181 A1 | 12/2014 | Young et al. |
| 2015/0374007 A1 | 12/2015 | Schnell, II et al. |
| 2016/0150908 A1 | 6/2016 | Boggabarapu |
| 2016/0295906 A1 | 10/2016 | Jacobsen |
| 2017/0049264 A1 | 2/2017 | Boggabarapu |
| 2017/0360242 A1 | 12/2017 | Boggabarapu |
| 2018/0000108 A1 | 1/2018 | Boggabarapu |
| 2019/0133377 A1 | 5/2019 | McCullough et al. |
| 2020/0337330 A1* | 10/2020 | Sung .................... A23F 5/04 |
| 2023/0007975 A1* | 1/2023 | Annumalla .......... A23N 12/125 |

FOREIGN PATENT DOCUMENTS

| | | |
|---|---|---|
| EP | 3972418 A1 | 3/2022 |
| JP | 60-110247 A | 6/1985 |
| JP | 62-100246 | 5/1987 |
| KR | 101457807 B1 | 11/2014 |
| KR | 20220011130 A | 1/2022 |
| WO | 2020/237220 A1 | 11/2016 |
| WO | 2018/053436 A1 | 3/2018 |

OTHER PUBLICATIONS

International Search Report and Written Opinion in International Application No. PCT/US2020/034398 mailed Oct. 6, 2020 (10 pages).
International Preliminary Report on Patentability for PCT/US2020/034398, dated Nov. 16, 2021, 7 pages.
ESSR for PCT/US2020034398, 12 pages.
JP Notice of Reasons for Rejection mailed Apr. 25, 2024.
KR Office Action for 10-2020-7038011, 19 pages.
Examiner's Requisition for CA 3139528 mailed May 9, 2025, 6 pages.

\* cited by examiner

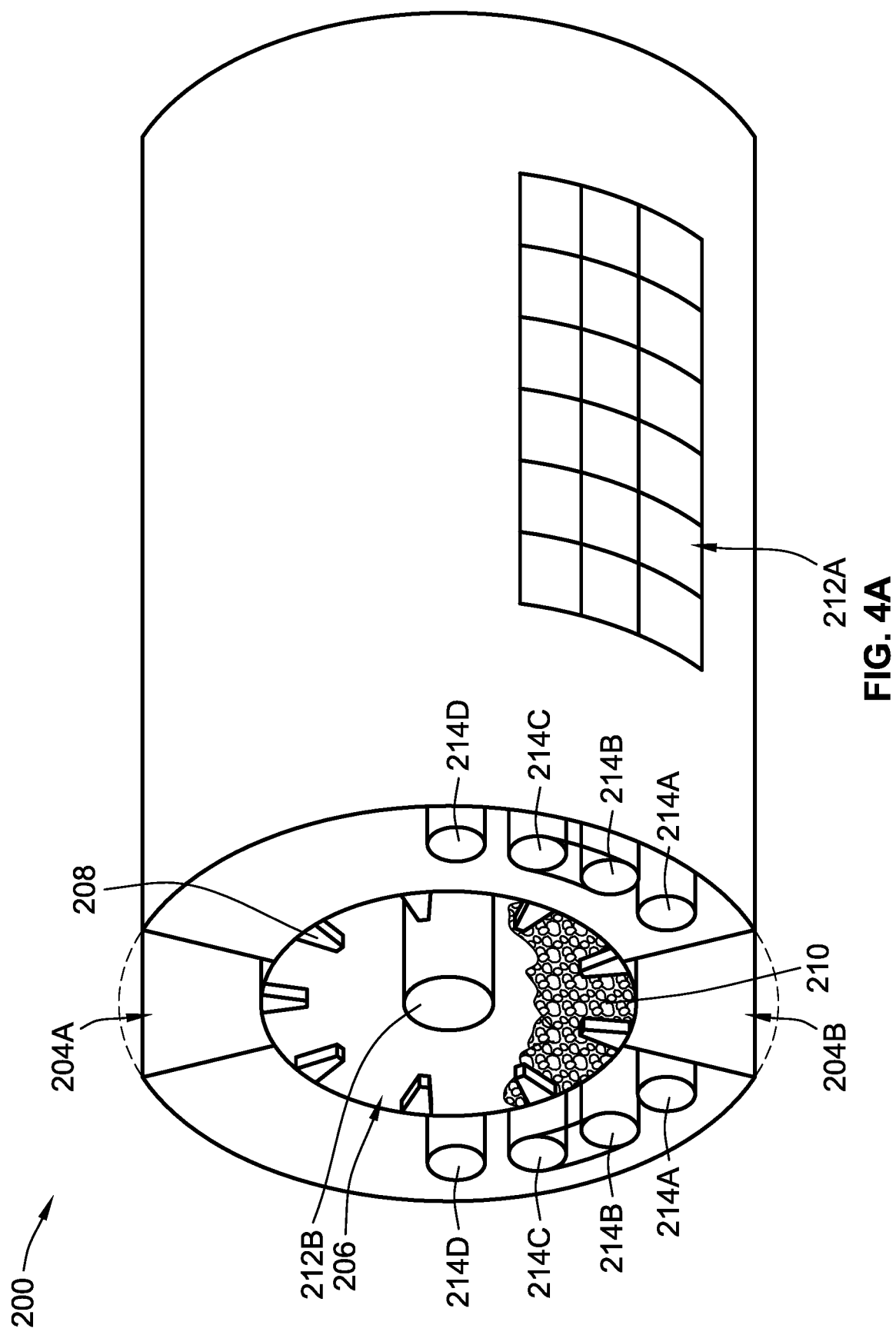

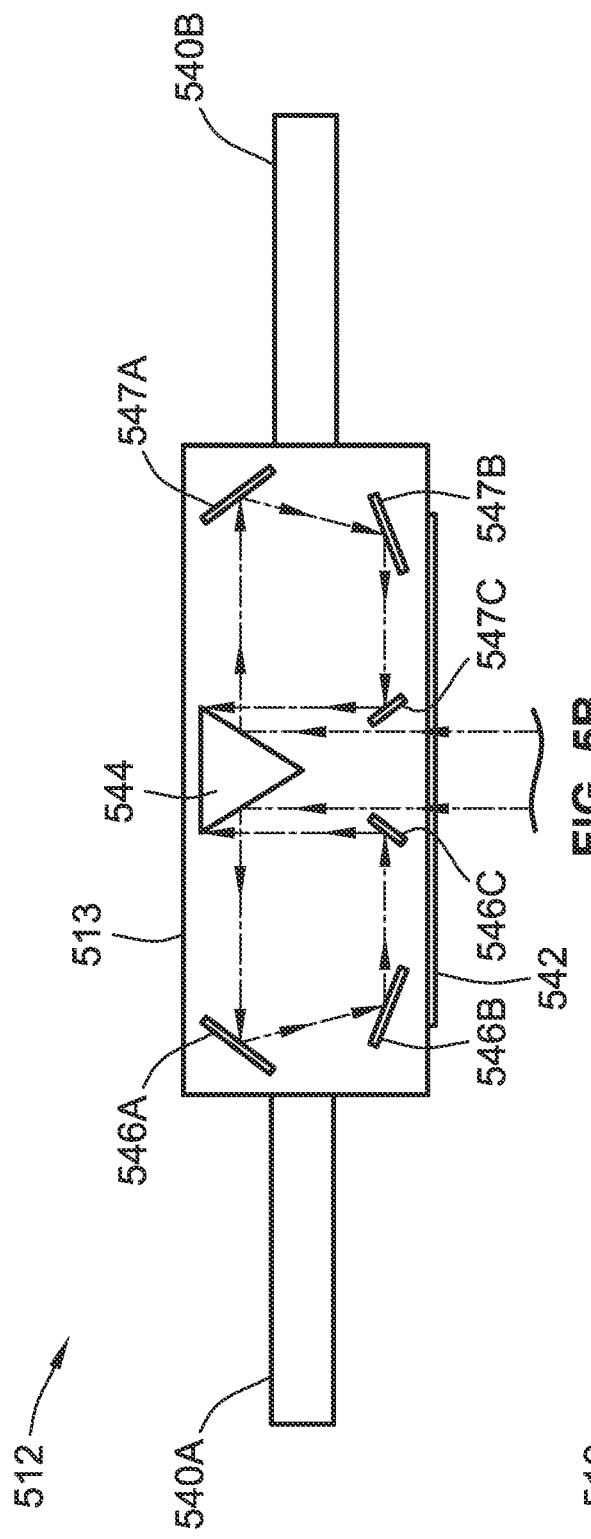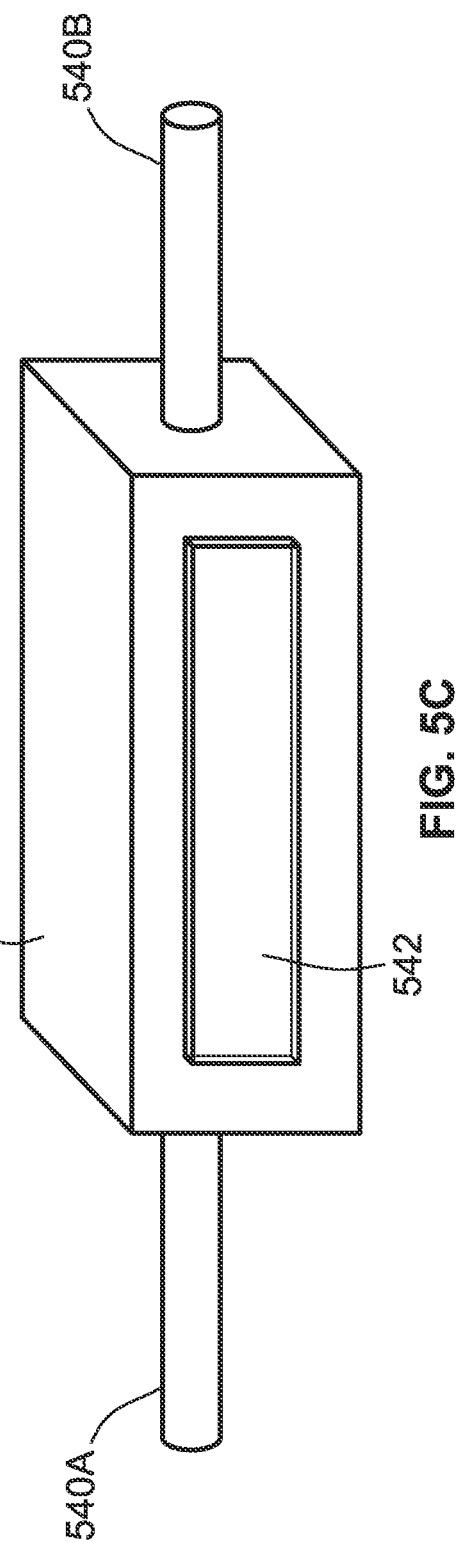

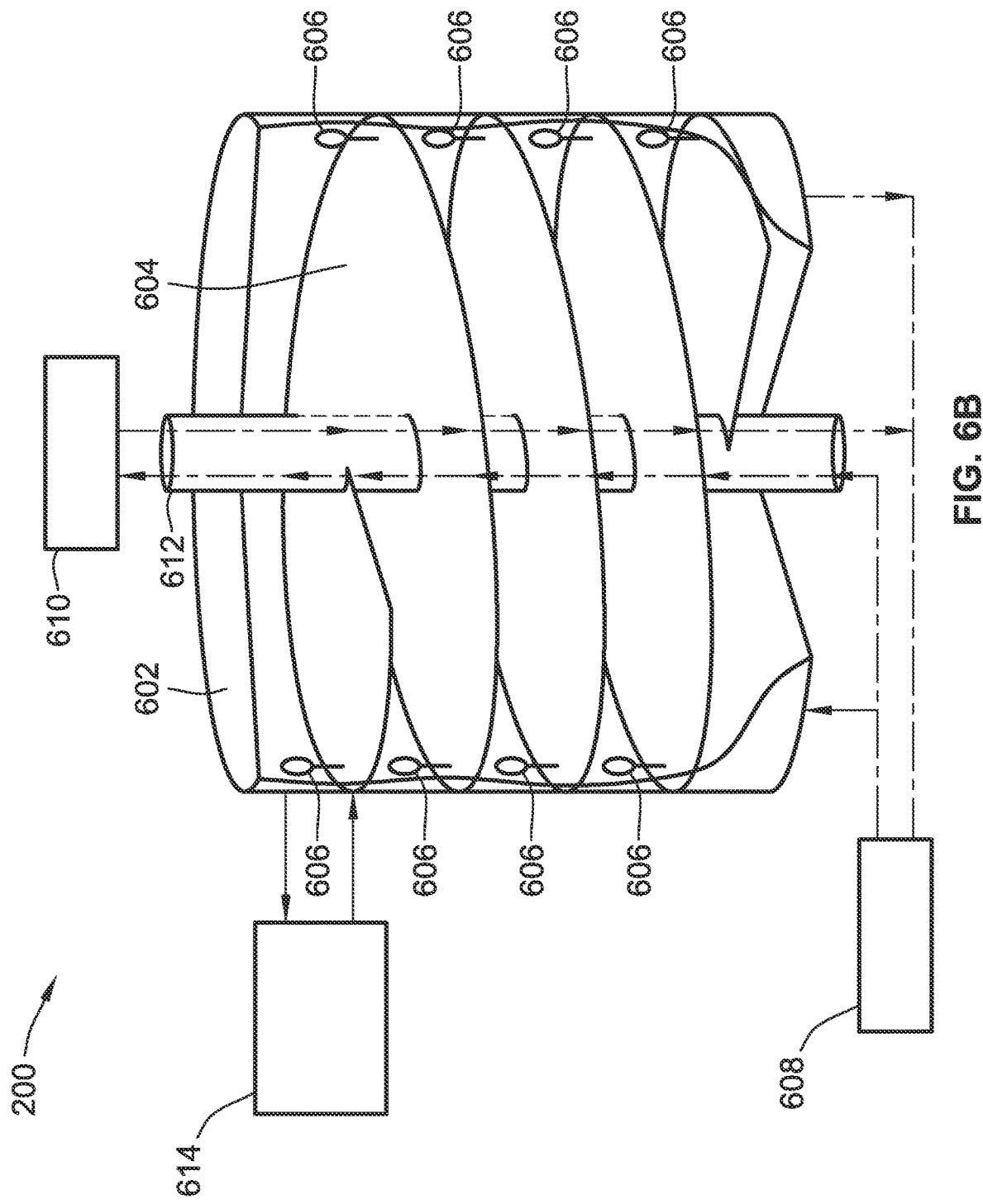

SYSTEMS AND METHODS FOR ROASTING COFFEE BEANS

CROSS-REFERENCE TO RELATED APPLICATIONS

This application is a continuation-in-part of International Application No. PCT/US2020/034398, filed May 22, 2020, which claims the benefit of and priority to U.S. Provisional Patent Application Ser. No. 62/851,458, filed on May 22, 2019, entitled "SYSTEMS AND METHODS FOR ROASTING COFFEE BEANS," which is hereby incorporated by reference herein in its entirety.

TECHNICAL FIELD

The present disclosure relates generally to a coffee bean roasting system. More particularly, aspects of this disclosure relate to a system that roasts coffee beans using electromagnetic radiation.

BACKGROUND

Properly roasting and curing coffee beans can be a long and difficult process. Various parameters must be controlled throughout the process to ensure that the coffee beans are correctly roasted and cured. Present systems for roasting and curing coffee beans often present difficulties in precisely roasting and curing the coffee beans and monitoring the process.

Thus, there is a need for an improved system that more accurately and precisely roasts and cures coffee beans.

SUMMARY

According to some aspects of the present disclosure, a system for heating an object comprises an electromagnetic radiation source, a first stage, a second stage, and a third stage. The electromagnetic radiation source is configured to emit electromagnetic radiation. The first stage includes a target area. At least a first portion of the electromagnetic radiation is directed toward the first stage. The first stage is configured to direct the object and the first portion of the electromagnetic radiation to the target area such that at least some of the first portion of the electromagnetic radiation strikes the object to thereby heat the object and produce particulate matter. The second stage has a cooling fluid flowing therethrough. The object is configured to move from the first stage and through the second stage to thereby cool the object. The third stage is fluidly coupled to the first stage such that air and the produced particulate matter flows from the first stage to the third stage. At least a second portion of the electromagnetic radiation is directed to the third stage such that at least some of the second portion of the electromagnetic radiation strikes the particulate matter to thereby incinerate at least some of the particulate matter. The third stage includes a filter, and is configured to direct the air in the third stage through the filter and out of a vent.

According to some aspects of the present disclosure, a system for heating an object comprises an electromagnetic radiation source, a roasting chamber, and a cooling vessel. The electromagnetic radiation source is configured to emit electromagnetic radiation. The roasting chamber is configured to receive the object and at least a first portion of the electromagnetic radiation. The roasting chamber is further configured to direct the first portion of the electromagnetic radiation toward the object such that at least some of the first portion of the electromagnetic radiation strikes the object to thereby heat the object. The cooling vessel is configured to receive the object from the roasting chamber and transport the object through the cooling vessel such that the object cools down.

According to some aspects of the present disclosure, a method of preparing coffee beans comprises placing one or more coffee beans into a roasting chamber. The roasting chamber includes a rotatable housing having a plurality of inwardly-extending fins configured to carry the coffee beans as the rotatable housing rotates. The method further comprising irradiating, using one or more electromagnetic radiation sources, (i) the coffee beans, (ii) an interior of the rotatable housing, or (iii) both (i) or (ii), while the rotatable housing rotates. The method further comprises, subsequent to the irradiating, moving the coffee beans to a cooling vessel. The method further comprises causing the coffee beans to move through the cooling vessel for a period of time to cool the coffee beans.

According to some aspects of the present disclosure, a coffee bean is prepared by a process that comprises placing one or more coffee beans into a roasting chamber. The roasting chamber has a rotatable housing that includes a plurality of inwardly-extending fins. The fins are configured to carry the coffee beans as the rotatable housing rotates. The process further comprises irradiating, using one or more electromagnetic radiation sources, (i) the coffee beans, (ii) an interior of the rotatable housing, or (iii) both (i) or (ii), while the rotatable housing rotates. The process further comprises, subsequent to the irradiating, moving the coffee beans to a cooling vessel. The process further comprises causing the coffee beans to move through the cooling vessel for a period of time to cool the coffee beans.

According to some aspects of the present disclosure, a coffee drink or product is prepared by a process that comprises placing one or more coffee beans into a roasting chamber. The roasting chamber includes a rotatable housing that has a plurality of inwardly-extending fins. The fins are configured to carry the coffee beans as the rotatable housing rotates. The process further comprises irradiating, using one or more electromagnetic radiation sources, (i) the coffee beans, (ii) an interior of the rotatable housing, or (iii) both (i) or (ii), while the rotatable housing rotates. The process further comprises, subsequent to the irradiating, moving the coffee beans to a cooling vessel. The process further comprises causing the coffee beans to move through the cooling vessel for a period of time to cool the coffee beans. The process further comprises using the coffee beans to prepare the coffee drink or product.

The above summary is not intended to represent each implementation or every aspect of the present disclosure. Additional features and benefits of the present disclosure are apparent from the detailed description and figures set forth below.

BRIEF DESCRIPTION OF THE DRAWINGS

The disclosure will be better understood from the following description of example implementations together with reference to the accompanying drawings.

FIG. 4A is a perspective cross-sectional view of a first implementation of a cooling vessel for use with the system of FIG. 1A, according to aspects of the present disclosure;

FIG. 5B is a front cross-sectional view of a generator for use with the cooling system of FIG. 5A, according to aspects of the present disclosure;

FIG. 5C is a perspective view of the generator of FIG. 5B, according to aspects of the present disclosure;

FIG. 6B is a perspective cross-sectional view of the cooling vessel of FIG. 6A, according to aspects of the present disclosure;

Figure 1A:
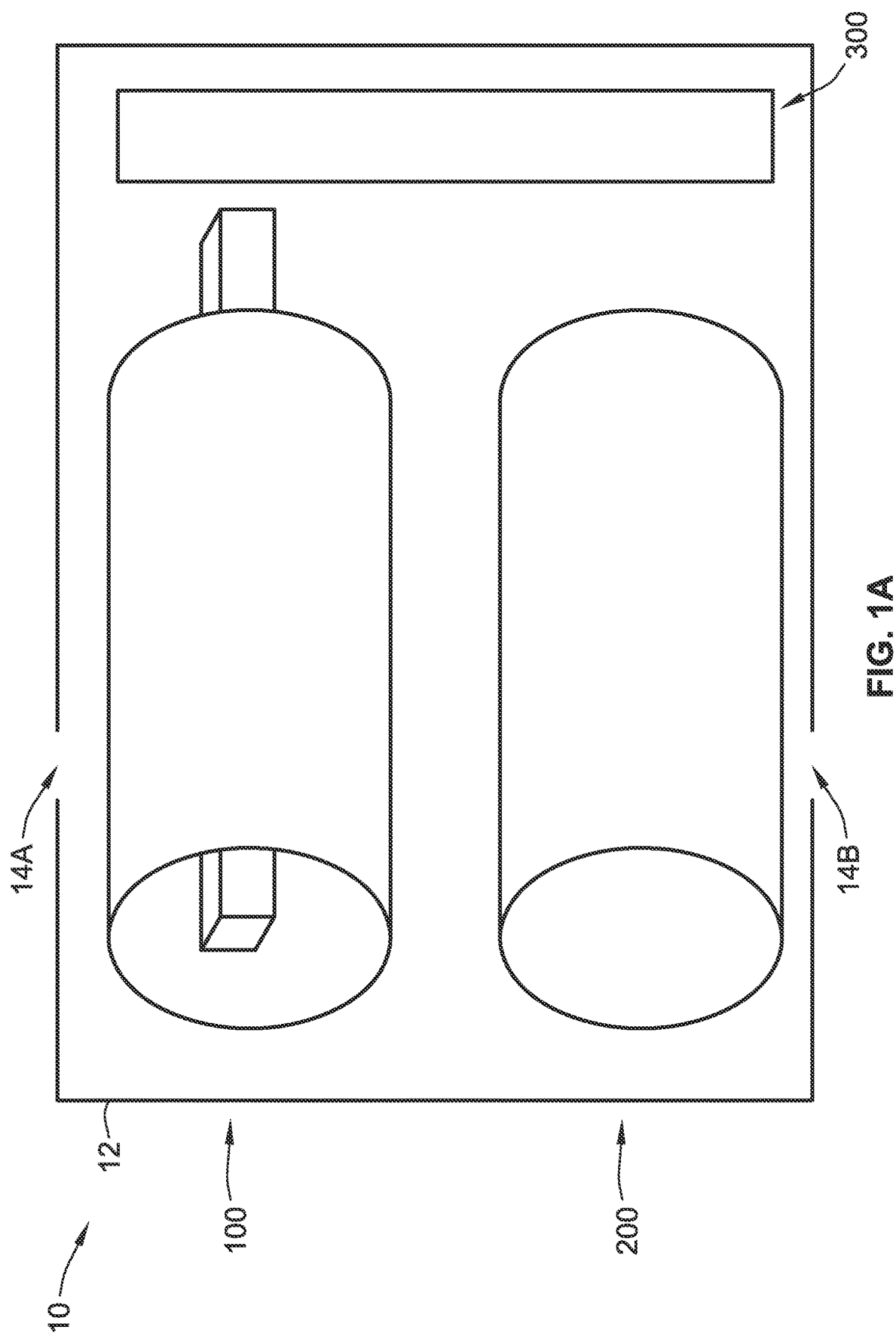
FIG. 1A is a diagram of a system for roasting coffee beans, according to aspects of the present disclosure.

While the present disclosure is susceptible to various modifications and alternative forms, specific implementations have been shown by way of example in the drawings and will be described in detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

While the present disclosure is susceptible of many different forms, there is shown in the drawings and will herein be described in detail example implementations of the present disclosure, with the understanding that the present disclosure is to be considered as an example of the principles of the present disclosure and is not intended to limit the broad aspect of the present disclosure to the illustrated implementations. Representative implementations are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 1B:
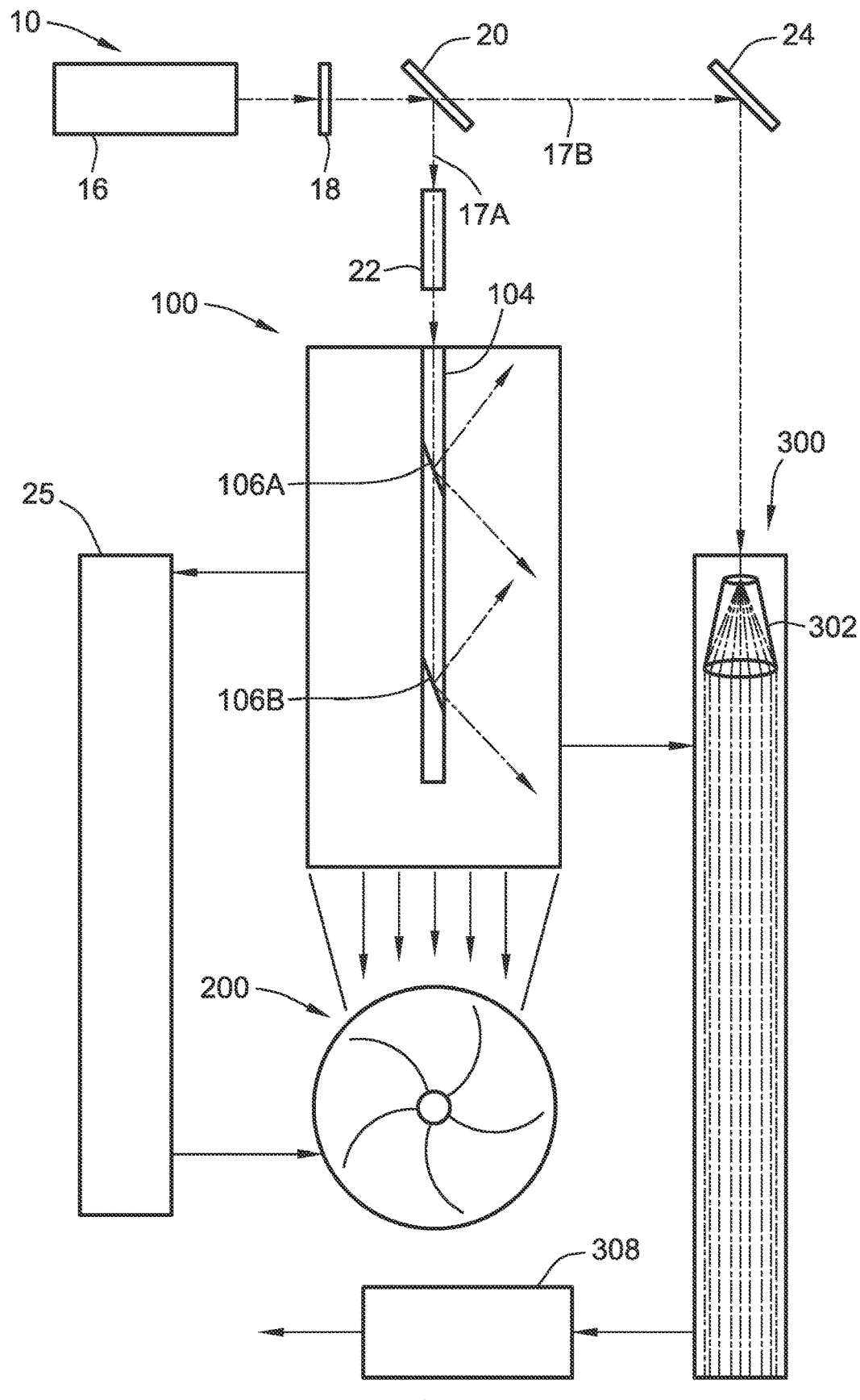
FIG. 1B is an additional diagram of the system of FIG. 1A, according to aspects of the present disclosure.

FIGS. 1A and 1B show a system 10 for roasting and cooling coffee beans. In some implementations, the system 10 can also be used for roasting and cooling other types of beans, such as soy beans, green beans, garbanzo beans; or generally any type of food, such as nuts, grains, etc. The system 10 can further be used for roasting and cooling non-food objects as well. While the description generally refers to coffee beans herein when describing the structure and function of the system, the substance of the description generally refers to any type of object that can be roasted and cooled using the system. Generally, the system 10 includes three stages. In the first stage, the coffee beans are roasted. In the second stage, the coffee beans are cooled and cured after they have been roasted. In the third stage, particulate matter produced during the first stage and/or the second stage is incinerated.

The first stage includes a roasting chamber 100, which is generally a sealed vessel into which one or more coffee beans (or other beans, or other objects) are placed during the roasting process. A variety of different components or mechanisms can be used to roast the beans. In the illustrated implementation, a laser is used to roast the beans. The second stage includes a cooling vessel 200. The cooling vessel 200 is configured to cool and cure the beans after roasting. The temperature, pressure, and humidity within the cooling vessel 200 can be strictly controlled to control the curing rate and optimize the cooling profile. Generally, the cooling vessel 200 is configured to cool the beans much quicker than in conventional systems, which quickly ends the roasting of the beans and locks in the flavor after roasting. The third stage includes an incineration vessel 300. During the roasting process, various types of particulate matter can be produced, such as chaff, smoke, etc. The air and the particulate matter from the roasting chamber 100 can be vented to the incineration vessel 300 where a substantial portion (if not all) of the particulate matter can be incinerated. The laser can be used in the incineration vessel 300 to incinerate the particulate matter. After incineration, the air from the incineration vessel 300 can be vented through a scrub box 308 to the atmosphere.

As shown in FIG. 1A, the system 10 includes a housing 12 in which the roasting chamber 100, the cooling vessel 200, and the incineration vessel 300 are located. The housing 12 can include an inlet 14A through which beans are inserted, and an outlet 14B through which the roasted and cooled beans are received. In some implementations, system 10 is generally gravity-fed, and the beans travel from the inlet 14A to the outlet 14B under the influence of gravity. In these implementations, the beans fall into the roasting chamber 100 through the inlet 14A of the housing 12; fall from the roasting chamber 100 to the cooling vessel 200; and fall from the cooling vessel 200 through the outlet 14B of the housing 12.

As shown in FIG. 1B, the system 10 also includes a laser 16 that can be used with both the roasting chamber 100 and the incineration vessel 300. The laser 16 can be any suitable type of laser. In some implementations, the laser 16 is a gas laser, such as a $CO_2$ (carbon dioxide) laser, a He—Ne (helium-neon) laser, an ion laser, a TEA (transversely excited atmospheric) laser, or others. In other implementations, the laser 16 is a fiber laser. In further implementations, the laser 16 is a semiconductor laser, such as a laser diode or a VCSEL (vertical cavity surface-emitting laser). In additional implementations, the laser 16 is a solid state laser, such as a Nd:YAG (neodymium-doped yttrium aluminum garnet) laser. Generally, the laser 16 can be any type of laser. In some implementations, the laser 16 is operated as a pulsed laser. In other implementations, the laser 16 is operated as a continuous wave laser. A variety of optical components can be used to direct the electromagnetic radiation emitted by the laser 16 to the roasting chamber 100 and the incineration vessel 300. One or more polarizers/attenuators 18 can be used to adjust the polarization and strength of the emitted electromagnetic radiation as needed. A beam splitter 20 can be placed into the path of the electromagnetic radiation to produce two separate beams of electromagnetic radiation. The first new beam 17A of electromagnetic radiation propagates toward the roasting chamber 100, while the second new beam 17B of electromagnetic radiation propagates toward the incineration vessel 300. A beam expander 22 can be used to adjust the beam width of the first beam 17A propagating toward the roasting chamber 100. Depending on the design or configuration of the system, a mirror 24 can be used to redirect the second beam 17B of electromagnetic radiation propagating toward the incineration vessel 300. Collimating optics 302 can be used to collimate the second beam 17B of electromagnetic radiation. In the illustrated implementation, the collimating optics 302 are positioned inside the incineration vessel 300. In other implementation, the collimating optics 302 are positioned outside the incineration vessel 300. As shown in FIG. 1B, the roasting chamber can include an optics arm 104 through which the first beam 17A propagates. The optics arm 104 can include optical components 106A, 106B used to direct the first beam 17A from the optics arm 104 into the inner cavity of the roasting chamber 100, where the beans are located, to roast the beams. FIG. 1B also illustrates a scrub box 308 through which the air from the incineration vessel 300 is passed through before being released to the atmosphere.

During the roasting process, the coffee beans absorb energy from the electromagnetic radiation that propagates within the interior of the roasting chamber 100. This absorption can result from direct contact between the electromagnetic radiation and the coffee beans as the electromagnetic radiation is emitted from the optics arm 104. The absorption can also result from contact between the electromagnetic radiation and the coffee beans as the electromagnetic radiation reflects off the surface of the interior of the roasting chamber 100. In some implementations, the coffee beans also absorb thermal energy caused by the general heating of the roasting chamber 100 due to the electromagnetic radiation. Various characteristics of the electromagnetic radiation can be modified as needed, including beam intensity, beam shape, beam profile, etc.

The system 10 also includes a carbon dioxide ($CO_2$) storage vessel 25. During the roasting of the coffee beans and following, the coffee beans emit $CO_2$. This $CO_2$ emission is due to the molecular change undergone by the coffee beans as a result of the roasting process as they transition to the final roasted stated. The emitted $CO_2$ can be stored in the $CO_2$ storage vessel 25 so that the emitted $CO_2$ can be used later for a variety of purposes, such as packing the coffee or other products. The stored $CO_2$ is an inert gas that can be used to maintain the freshness of the beans or other products, and can replace nitrogen tanks and generation systems used for that purposes. In some implementations, the $CO_2$ storage vessel 25 is connected to the cooling vessel 200, so that the stored $CO_2$ can be used to aid in cooling the roasted coffee beans.

Figure 2A:
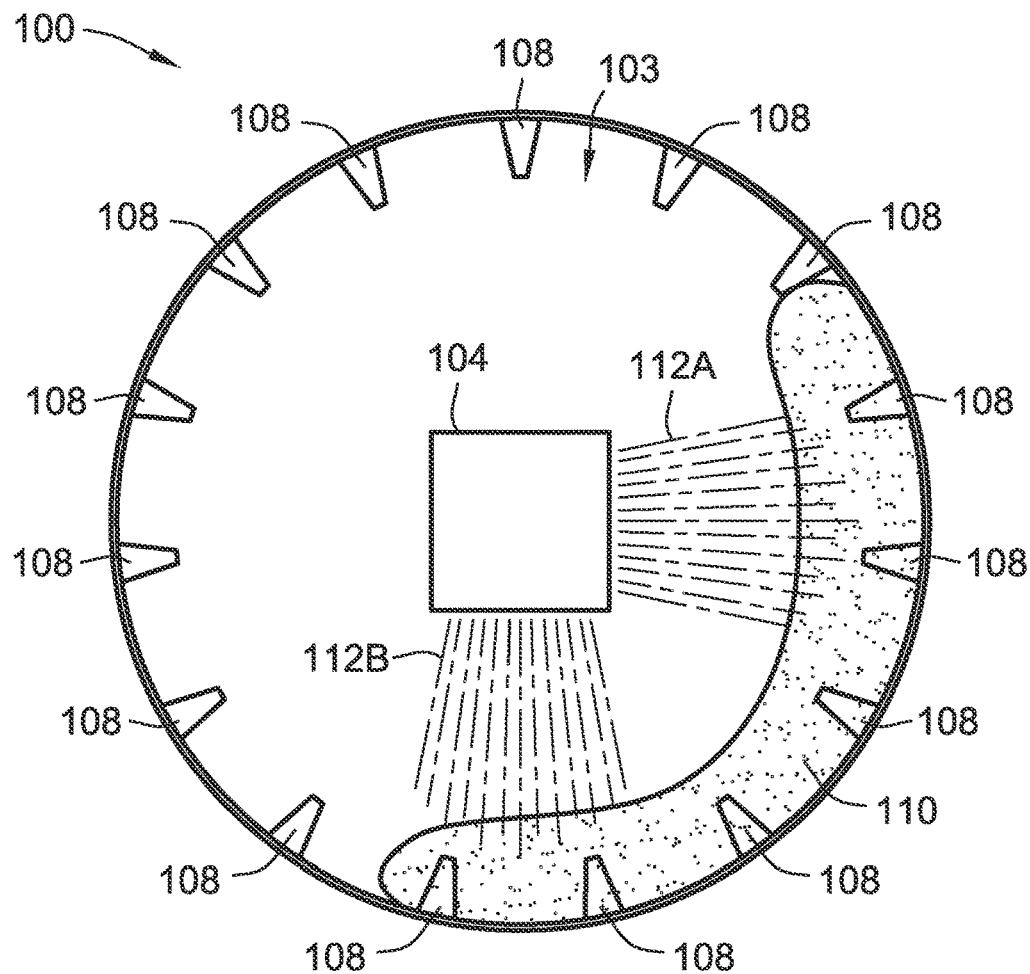
FIG. 2A is an end cross-sectional view of a roasting chamber of the system of FIG. 1A, according to aspects of the present disclosure.
Figure 2B:
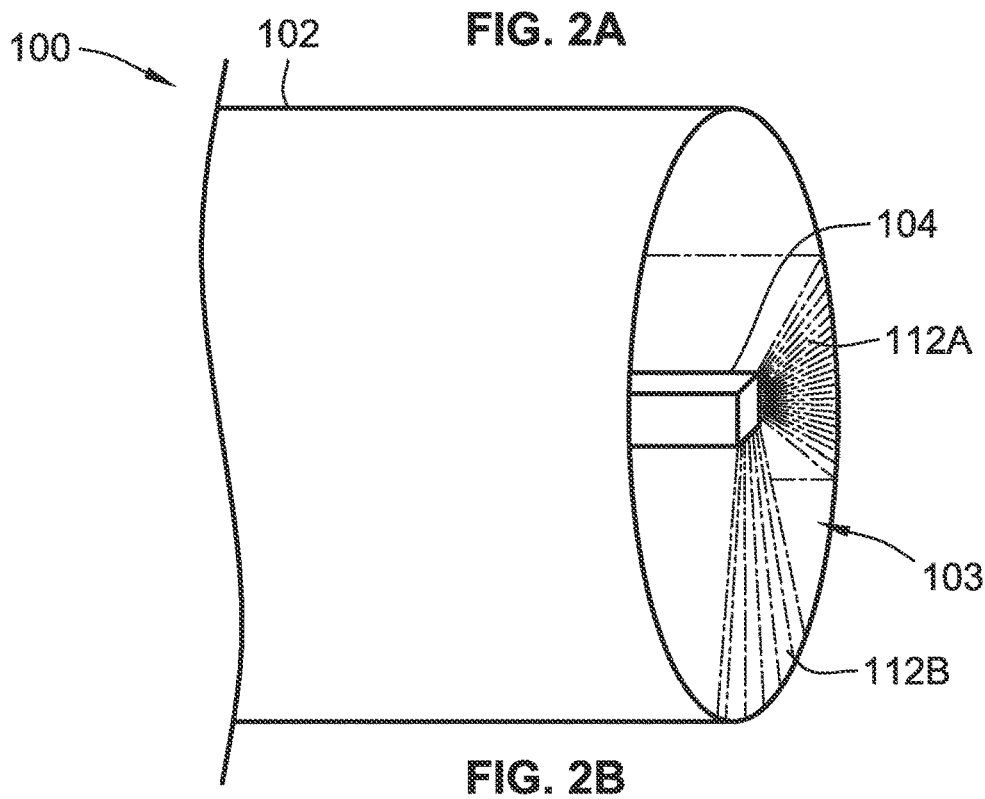
FIG. 2B is a perspective cross-sectional view of the roasting chamber of FIG. 2A, according to aspects of the present disclosure.

Referring now to FIGS. 2A and 2B, in some implementations the roasting chamber 100 is a rotating drum into which the coffee beans can placed. FIG. 2A shows an end view of the roasting chamber 100, while FIG. 2B is a perspective view of the roasting chamber 100. The roasting chamber 100 includes a rotatable housing 102 defining an inner cavity 103. The housing 102 has a generally cylindrical shape. The housing 102 is configured to rotate about a rotational axis when the roasting chamber 100 is in use. The optics arm 104 extends along the rotational axis of the housing 102, and is located in the inner cavity 103. As is explained in more detail herein, the optics arm 104 includes optical components 106A, 106B used to direct electromagnetic radiation out of the optics arm to a target area within the interior of the housing 102 and/or on an inner surface of the housing 102.

In the illustrated implementation, the housing 102 of the roasting chamber 100 rotates counterclockwise about the rotational axis. The roasting chamber 100 includes a plurality of fins 108 that aid in maintaining the coffee beans in the target area during rotation of the roasting chamber 100. The plurality of fins 108 are circumferentially distributed about the inner surface of the housing 102. Each of the plurality of fins 108 extends inwardly from a respective point on the inner surface of the housing 102. Each of the fins 108 is angled relative to a radial axis that connects (i) the rotational axis of the housing 102 to (ii) the respective point on the inner surface of the housing 102. The housing 102 can have a circular cross-section with the rotational axis positioned in the center of this circle, such that the radial axis that the fins extend along connects a center point of the housing 102 (e.g., a center point of the circular cross-section) to the respective point on the inner surface of the housing 102. The radial axis is also generally normal to the inner surface of the housing 102. As the roasting chamber 100 rotates, the fins 108 hold coffee beans 110 and carry the coffee beans 110 upward. The coffee beans 110 are carried upward until gravity causes the coffee beans 110 to fall off of the fins 108 and back to the bottom of the housing 102. Once there, the coffee beans 110 can again be carried upward by the fins 108 as the roasting chamber 100 rotates. Thus, each of the fins 108 will generally hold a portion of the coffee beans 110 for a period of time as the housing 102 rotates.

As the roasting chamber 100 rotates, the fins 108 generally maintain the coffee beans 110 within the target area, which is where the electromagnetic radiation from the optics arm 104 is aimed at. The angle of the fins 108 and the rotation speed of the roasting chamber 100 control how long the fins 108 carry the coffee beans 110 upward, until gravity overcomes friction and/or other forces to cause the coffee beans 110 to fall off the fins 108. Thus, the angle of the fins 108 and the rotation speed of the roasting chamber 100 are selected such that the coffee beans 110 remain within the target area for a desired amount of time before falling off the fins 108. Thus, the physical structure of the roasting chamber 100 is designed to precisely control the roasting process. In some implementations, the angle of the fins is between about 0° relative to normal and about 30° relative to normal. In some implementations, the roasting chamber 100 rotates at a speed of between about 5 revolutions per minute (RPM) and about 30 RPM. In some implementations, the roasting chamber 100 is configured to roast the beans to a temperature of between about 170 degrees and about 195 degrees. The roasting chamber 100 itself can be pressurized.

As shown in FIG. 2A, the electromagnetic radiation that is emitted from the optics arm 104 can be emitted as two different cones of electromagnetic radiation 112A, 112B. Emitted cone of electromagnetic radiation 112A is aimed downward, while emitted cone of electromagnetic radiation 112B is aimed rightward. Because FIG. 1A is an end view of the roasting chamber 100 and the optics arm 104, the two emitted beams of electromagnetic radiation 112A, 112B also extend along the axial distance of the roasting chamber 100 and the optics arm 104 into the page. In some implementations, the emitted beams of electromagnetic radiation 112A, 112B are scanned back and forth in this direction (into and out of the page). In other implementations, the emitted beams of electromagnetic radiation 112A, 112B constantly occupy a certain distance along the axial length of the drum.

The first stage can include a number of sensors or detectors within the roasting chamber 100 to monitor and track the roasting process. These sensors and/or detectors can be configured to monitor humidity, $CO_2$ content, acidity, ambient temperature outside of the housing 102 of the roasting chamber 100, internal temperature within the housing 102 of the roasting chamber 100, or the amount/volume/weight of the coffee beans within the roasting chamber 100. The sensors and/or detectors can also be configured to monitor and record sounds within the roasting chamber 100, capture standard images or thermal images, or perform other suitable functions. These parameters are quantified to monitor the progress of the roasting. The position and size of the electromagnetic radiation can be adjusted as needed to ensure optimal roasting. In some implementations, the roasting chamber 100 includes one or more laser diode modules attached thereto. The laser diode modules are used to further irradiate the roasting chamber 100 to help control the internal temperature of the drum. The laser diode modules can be arranged in any desired configuration, such as an array, grid, etc.

In the illustrated implementation, FIGS. 2A and 2B show electromagnetic radiation being emitted at approximately the 3 o'clock position and the 6 o'clock position. However, the optics arm 104 can be configured to cause electromagnetic radiation to be emitted at any location within the housing 102 of the roasting chamber 100. The electromagnetic radiation could be emitted at all locations around the circumference of the optics arm 104, at only a single location around the circumference of the optics arm 104, etc. Further, the electromagnetic radiation can be emitted along the entire longitudinal length of the optics arm 104 within the housing 102, or only at select locations along the longitudinal length of the optics arm 104.

While the illustrated implementation shows the optics arm 104 extending into the interior of the roasting chamber 100, other implementations of the roasting chamber 100 may not include the optics arm 104 as illustrated. For example, in some implementations, the optics arm 104 may terminate at some point within system 10 short of the roasting chamber 100, and the electromagnetic radiation from the optics arm 104 can be directed into the roasting chamber 100. In some of these implementations, the roasting chamber 100 includes imaging optics that direct the electromagnetic radiation to the target area. In others of these implementations, the optics arm 104 is positioned relative to the roasting chamber 100 such that the electromagnetic radiation from the optics arm 104 will be incident on the target area without any additional imaging optics.

In further implementations, the roasting chamber 100 may not include the optics arm 104 at all. Instead, an electromagnetic radiation source (which could be a variety of different types of lasers, including a fiber laser) may be disposed outside or inside the roasting chamber 100. Electromagnetic radiation from the electromagnetic radiation source can be directed to the target area with or without the use of any imaging optics.

Figure 3A:
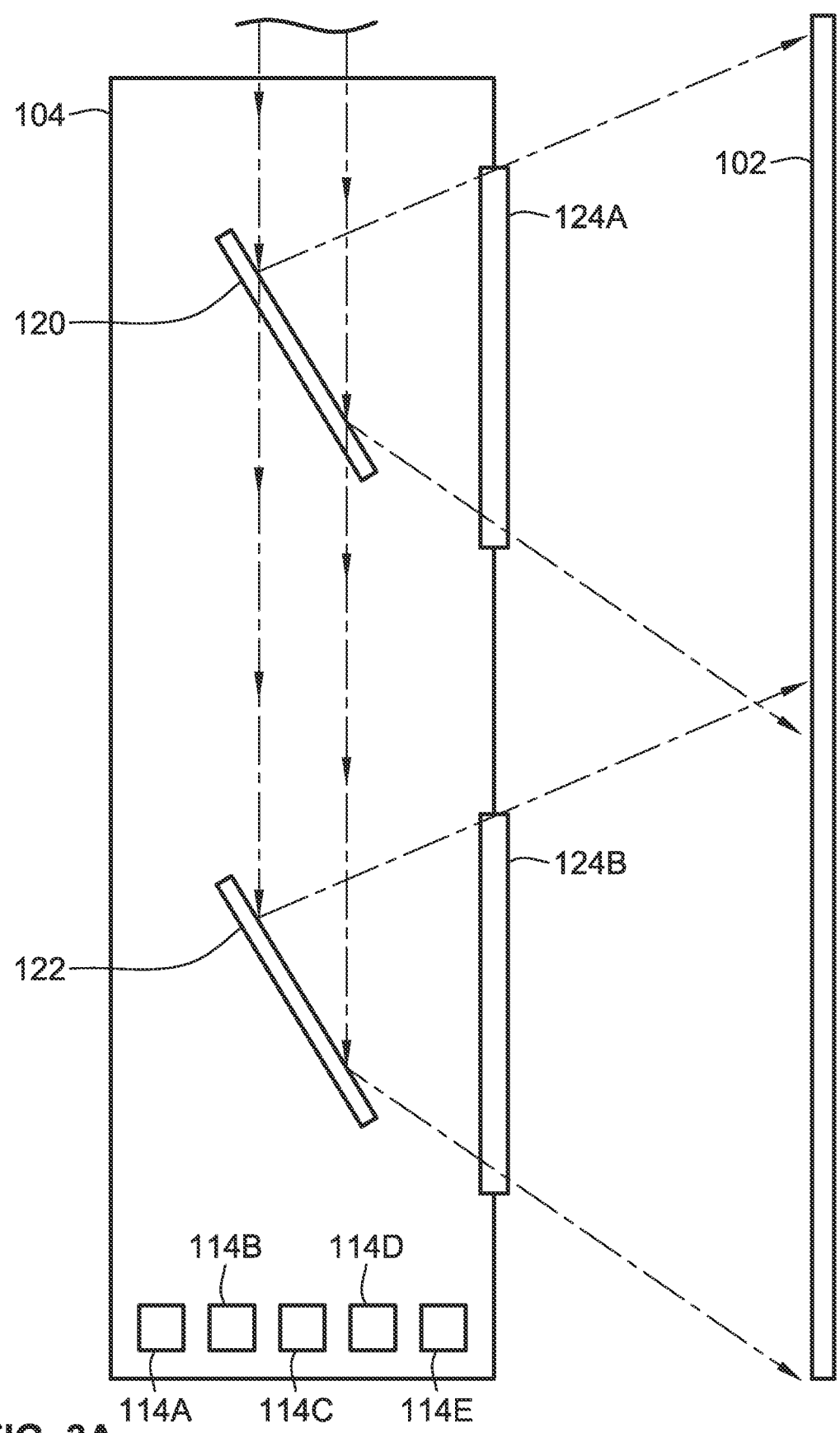
FIG. 3A is a top cross-sectional view of a first implementation of an optics arm of the roasting chamber of FIG. 1A, according to aspects of the present disclosure.

FIG. 3A illustrates a first implementation of the optics arm 104. FIG. 3A shows a top cross-section of the optics arm 104 and a portion of the housing 102 of the roasting chamber 100. The optics arm 104 in this implementation includes a beam splitter 120 and a mirror 122. The beam splitter 120 is partially reflective such that a portion of the electromagnetic radiation that is incident on the beam splitter 120 combination is reflected radially outward out of the optics arm 104 through window 124A. The beam splitter 120 may be made of material that is naturally partially reflective, or may be made of a generally transparent substrate that is optically coated with a partially transparent material. The remaining portion of the incident electromagnetic radiation is transmitted through the beam splitter 120 to the mirror 122. The mirror 122 reflects this remaining electromagnetic radiation radially outward out of the optics arm 104 through window 124B. Thus, the electromagnetic radiation transmitted to the roasting chamber 100 is reflected toward the interior surface of the housing 102, and a large area on the inner surface of the housing 102 is irradiated.

In the implementation of FIG. 3A, the beam of electromagnetic radiation entering the optics arm 104 generally has a relatively broad beam width formed from parallel rays (e.g., the electromagnetic radiation is collimated). The beam splitter 120 and the mirror 122 are positioned at an angle relative to the electromagnetic radiation, and thus the electromagnetic radiation that reflects off of the beam splitter 120 and the mirror 122 diverges as it reflects off the beam splitter 120 and the mirror 122. The electromagnetic radiation thus forms two cones of electromagnetic radiation that are directed toward the target area. In some implementations, one or both of the beam splitter 120 and the mirror 122 may be formed as part of a mirror galvanometer, which allows for the angle at which the beam splitter 120 and the mirror 122 are mounted relative to the incoming beam to be precisely physically controlled.

Figure 3B:
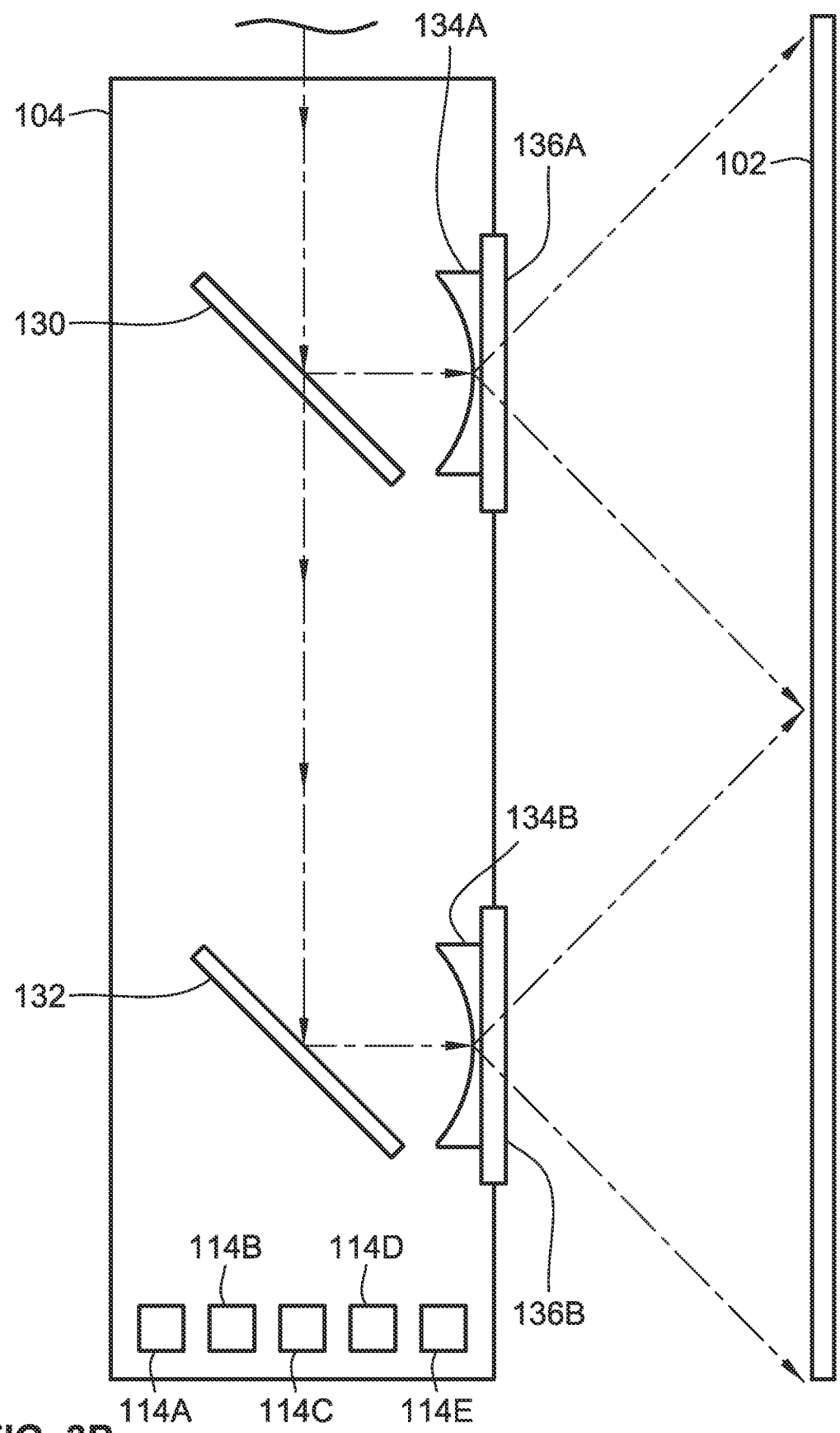
FIG. 3B is a top cross-sectional view of a second implementation of an optics arm of the roasting chamber of FIG. 1A, according to aspects of the present disclosure.

FIG. 3B illustrates a further implementation of the optics arm 104. In this implementation, the optics arm 104 includes a beam splitter 130 and a mirror 132, similar to FIG. 3A. However, the implementation in FIG. 3B further includes two diverging lenses 134A, 134B, and the electromagnetic radiation entering the optics arm 104 has a relatively narrow beam width compared to the implementation in FIG. 3A, but is still generally formed from parallel rays. A portion of the narrow beam of electromagnetic radiation reflects off of the beam splitter 130 radially outward toward diverging lens 134A, while the remainder of the narrow beam of electromagnetic radiation propagates to mirror 132, where it then reflects radially outward toward diverging lens 134B. The diverging lenses 134A, 134B cause the two narrow beams of parallel rays of electromagnetic radiation to diverge as they exit through windows 136A, 136B, resulting in the same two cones of electromagnetic radiation propagating toward the target area on the inner surface of the housing 102, such that a large area on the inner surface of the housing 102 is irradiated. Similar to FIG. 3A, the beam splitter 130 and/or the mirror 132 can be mirror galvanometers, so that their angles relative to the incoming beam can be controlled.

Figure 3C:
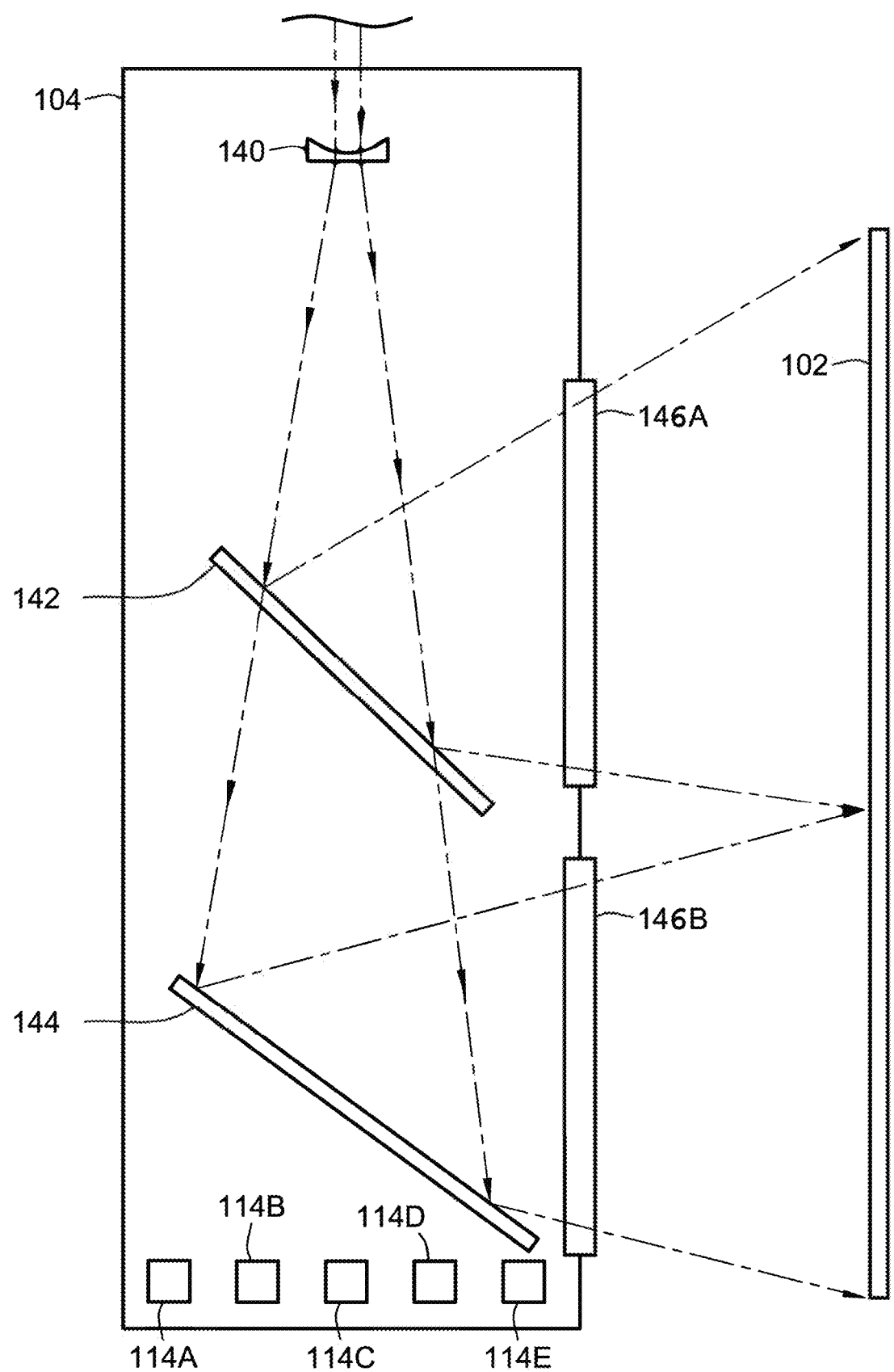
FIG. 3C is a top cross-sectional view of a third implementation of an optics arm of the roasting chamber of FIG. 1A, according to aspects of the present disclosure.

FIG. 3C illustrates another implementation of the optics arm 104. In this implementation, the optics arm includes a diverging lens 140, a beam splitter 142, and a mirror 144. The electromagnetic radiation that enters the optics arm 104 has a relatively narrow beam shape formed from parallel rays, similar to the implementation in FIG. 3B. The electromagnetic radiation refracts through the diverging lens 140, and spreads out as it propagates toward the beam splitter 142. Thus, the electromagnetic radiation propagating toward the beam splitter 142 and the mirror 144 is not formed from generally parallel rays, but instead of diverging rays. A portion of this electromagnetic radiation reflects radially outward off of the beam splitter 142 and propagates through window 146A toward the inner surface of the housing 102. The rest of the electromagnetic radiation transmits through the beam splitter 142 and reflects radially out ward off of mirror 144. This electromagnetic radiation then propagates through window 146B toward the inner surface of the housing 102. Thus, the single diverging lens 140 results in two cones of electromagnetic radiation being emitted from the optics arm 104, such that a large area on the inner surface of the housing 102 is irradiated. Any one of the diverging lens 140, the beam splitter 142, or the mirror 144 can be formed as part of a mirror galvanometer, so that their angles relative to the incoming beam can be controlled.

Figure 3D:
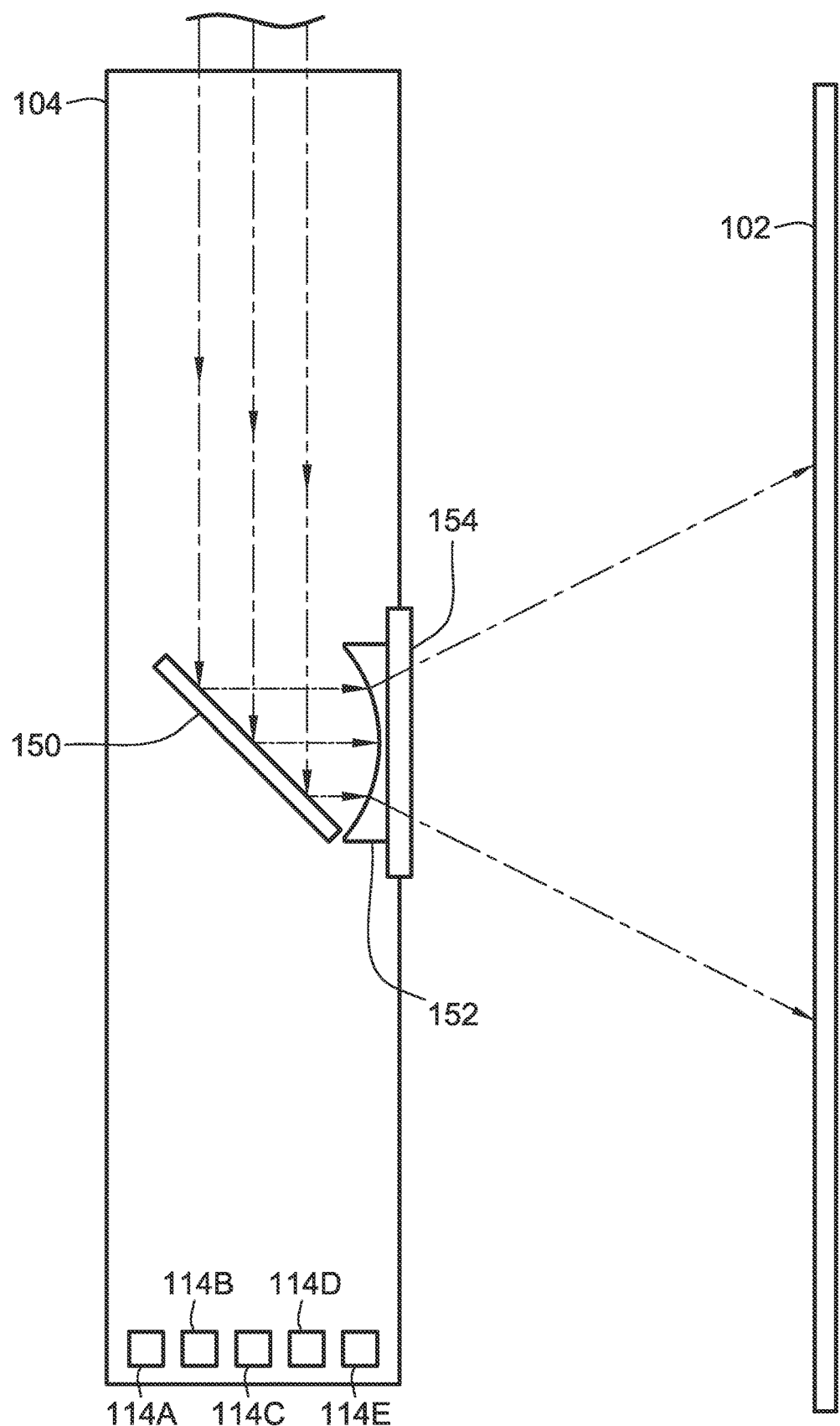
FIG. 3D is a top cross-sectional view of a fourth implementation of an optics arm of the roasting chamber of FIG. 1A, according to aspects of the present disclosure.

FIG. 3D illustrates yet another implementation of the optics arm 104. In this implementation, the optics arm 104 includes a single mirror 150 and a single diverging lens 152. The electromagnetic radiation entering the optics arm 104 has a broad beam shape formed from generally parallel rays as it enters the optics arm 104. The broad beam of electromagnetic radiation reflects radially outward off the mirror 150 and propagates through the diverging lens 152 and the window 154. The diverging lens 152 causes the electromagnetic radiation to diverge as it passes through the window 154 and propagates toward the inner surface of the housing 102, such that a large area on the inner surface of the housing 102 is irradiated. The mirror 150 can be formed as part of a mirror galvanometer, so that its angle relative to the incoming beam can be controlled.

Figure 3E:
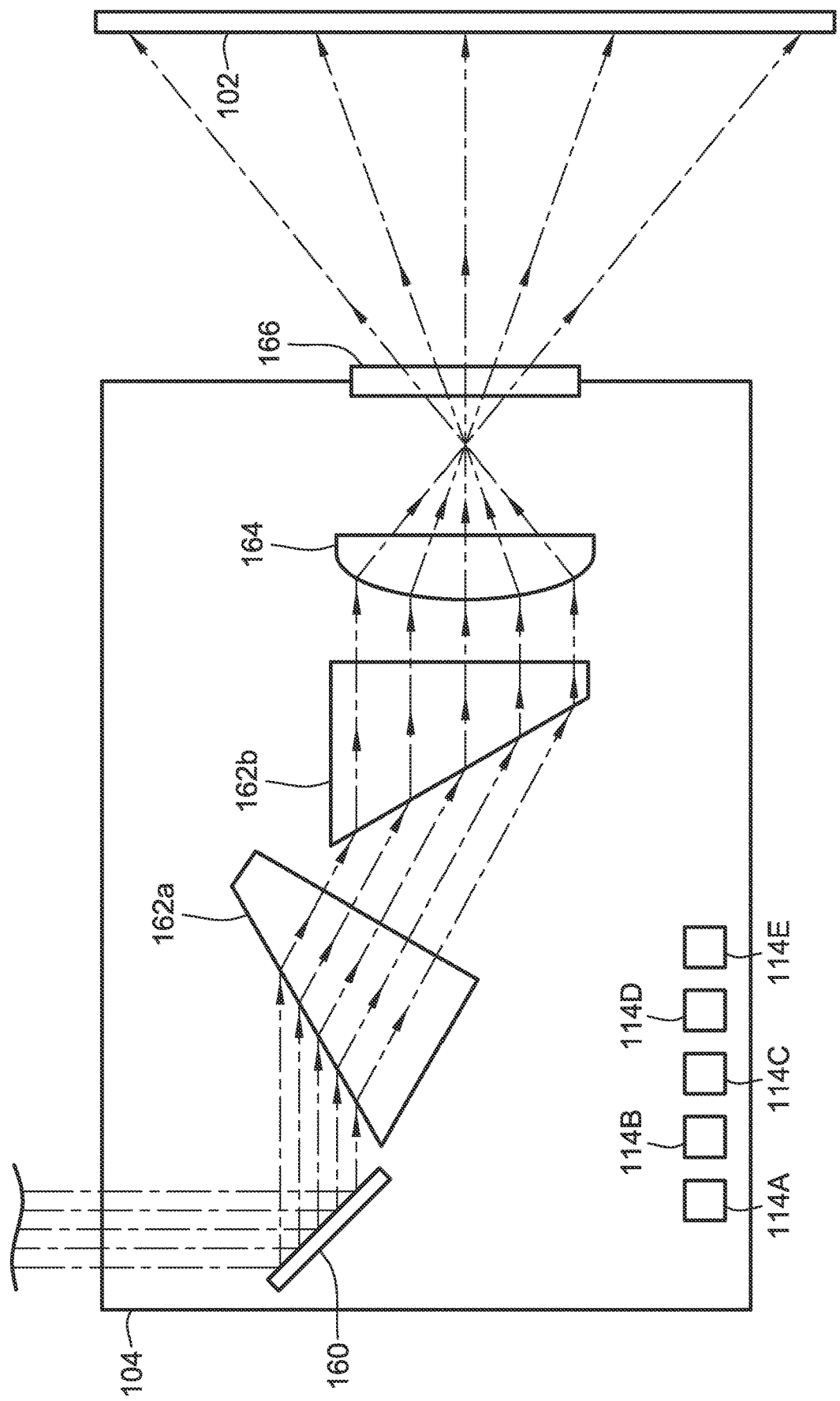
FIG. 3E is a top cross-sectional view of a fifth implementation of an optics arm of the roasting chamber of FIG. 1A, according to aspects of the present disclosure.

FIG. 3E is yet another implementation of the optics arm 104. In this implementation, the optics arm 104 includes a mirror 160, a pair of anamorphic prisms 162A and 162B, and a lens 164. The electromagnetic radiation entering the optics arm 104 is formed from generally parallel rays. The mirror 160 reflects the electromagnetic radiation radially outward toward the anamorphic prisms 162A, 162B. The anamorphic prisms 162A, 162B broaden the beam width of the electromagnetic radiation. However, the electromagnetic radiation that is emitted from the prisms 162A, 162B is still formed from generally parallel rays, and is propagating in the same direction. This electromagnetic radiation then passes through lens 164. Lens 164 is a plano-convex lens with one spherical surface and one flat surface. Lens 164 causes the electromagnetic radiation to be focused to a focal point within the optics arm 104, which thus causes the electromagnetic radiation to diverge as it propagates past the focal point, through window 166, and toward the inner surface of the housing 102, such that a large area on the inner surface of the housing 102 is irradiated. Any one of the mirror 160, the anamorphic prism 162A, the anamorphic prism 162B, or the lens 164 can be formed as part of a mirror galvanometer, so that their angles relative to the incoming beam can be controlled.

Figure 3F:
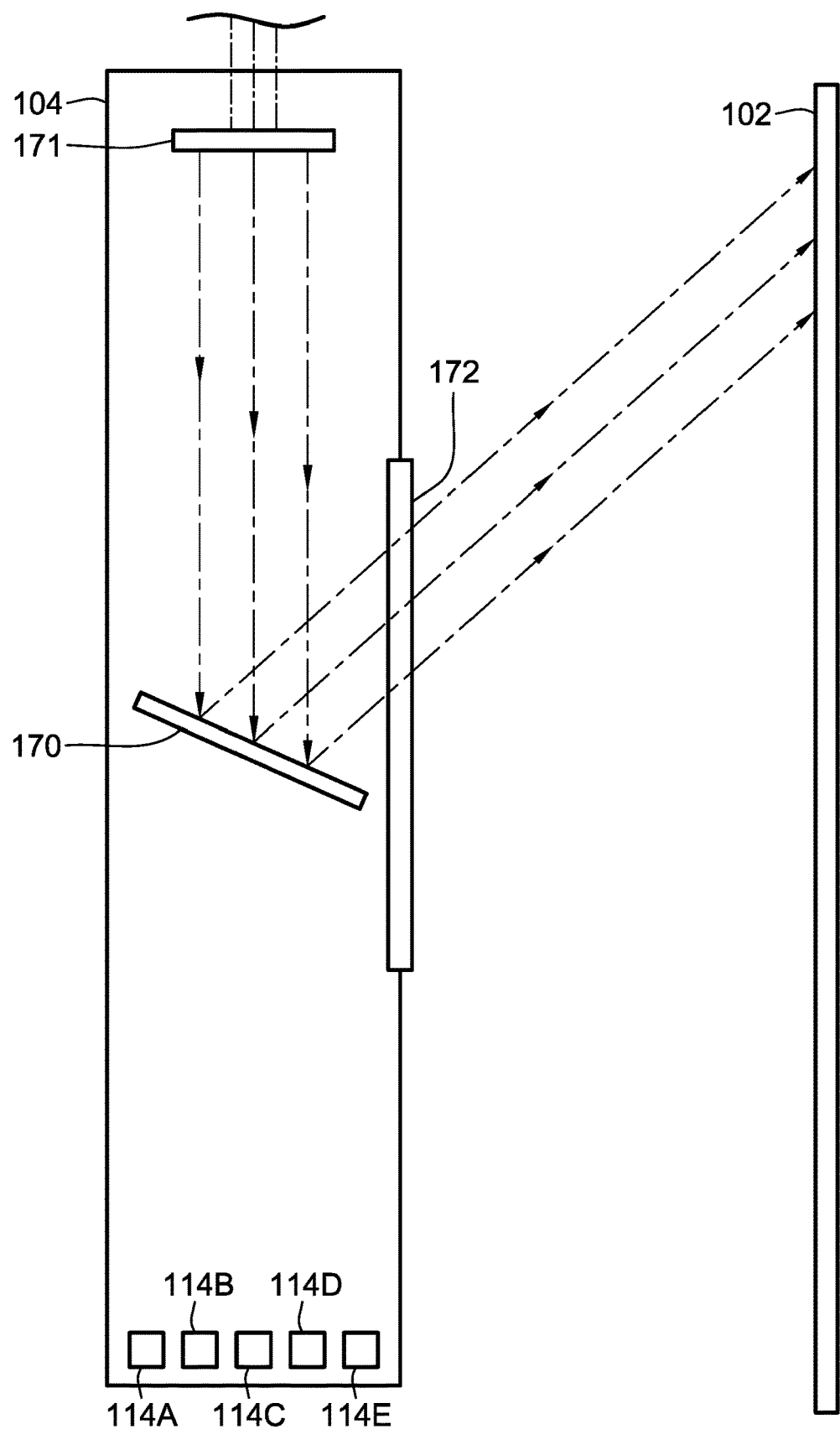
FIG. 3F is a top cross-sectional view of a sixth implementation of an optics arm of the roasting chamber of FIG. 1A when a movable mirror is in a first position, according to aspects of the present disclosure.
Figure 3G:
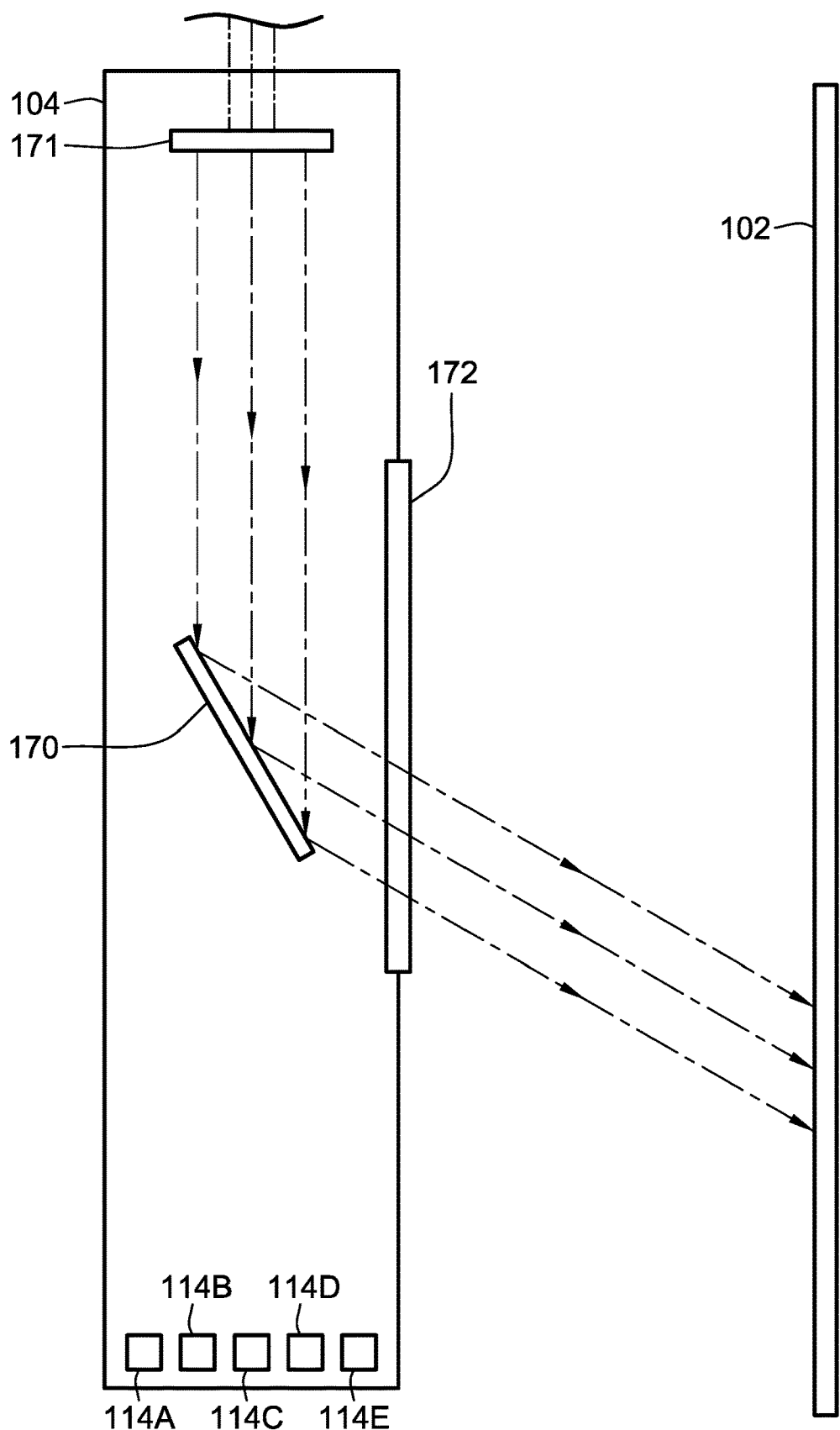
FIG. 3G is a top cross-sectional view of the optics arm of FIG. 3F when the movable mirror is in a second position, according to aspects of the present disclosure.

FIGS. 3F and 3G illustrate an additional implementation of the optics arm 104. In this implementation, the optics arm 104 includes imaging optics 171 a movable mirror 170. The mirror 170 can be any suitable type of movable mirror, such as a mirror galvanometer (e.g., a mirror mounted on a motor configured to rotate and/or move the mirror), so that the angle of the mirror 170 relative to the incoming beam can be controlled. As shown in FIG. 3G, the incoming beam of electromagnetic radiation is incident on the imaging optics 171. The imaging optics 171 can be any combination of one or more optical components that operate in any desired way on the incoming beam of electromagnetic radiation. FIGS. 3F and 3G illustrate a simplified implementation of the imaging optics 171, which are configured to broaden the electromagnetic radiation that is then incident on the mirror 170. In this implementation, the imaging optics 171 can include a beam expander (such as a concave lens) and a collimator. The imaging optics 171 could also include other combinations of optical components configured to broaden the beam of electromagnetic radiation. In other implementations, the imaging optics 171 could include only a collimator if the incoming beam of electromagnetic radiation is sufficiently broad. In further implementations, the imaging optics 171 can be configured to narrow the incoming beam of electromagnetic radiation on the mirror 170. In even further implementations, the optics arm 104 in this implementation does not include any imaging optics 171, if the incoming electromagnetic radiation already has the characteristics required for use with the movable mirror 170.

In any implementation, the electromagnetic radiation output from the imaging optics 171 is incident on the mirror 170, which reflects the electromagnetic radiation radially outward toward and through a window 172 that is formed in the side of the optics arm 104. The electromagnetic radiation that propagates through the window 172 is then incident on the interior surface of the housing 102 of the roasting chamber 100. Thus, the mirror 170 is configured to direct the incoming beam of electromagnetic radiation onto the target area or a portion of the target area.

The mirror 170 is configured to rotate through a range of motion. FIG. 3F shows the mirror 170 in a first position, where the mirror 170 is rotated generally to a first end of its range of motion. FIG. 3G shows the mirror 170 in a second position, where the mirror 170 is rotated generally to a second end of its range of motion. In FIG. 3F, the electromagnetic radiation that reflects off of the mirror 170 is directed to (e.g., is incident on) a first end of the inner surface of the housing 102 (e.g. an upper end of the inner surface relative to the plane of FIG. 3F). In FIG. 3G, the mirror 170 is rotated so that the electromagnetic radiation that reflects off of the mirror 170 is directed to (e.g., is incident on) a first end of the inner surface of the housing 102 (e.g., a lower end of the inner surface relative to the plane of FIG. 3G).

During operation of the system 10, the mirror 170 can be continually scanned back and forth across its range of motion so that the electromagnetic radiation that reflects off of the mirror 170 will be directed to (e.g., will be incident on) all desired portions of the inner surface of the housing 102 of the roasting chamber 100. Thus, the target area on the inner surface of the housing 102 may be larger than the width of the beam of electromagnetic radiation emitted through the window 172. When the mirror 170 is at the first end of its range of motion, the electromagnetic radiation is directed to (e.g., is incident on) the first end of the target area. When the mirror 170 is at the second end of its range of motion, the electromagnetic radiation is directed to (e.g., is incident on) the second end of the target area. Thus, in response to the mirror 170 moving between the first end of its range of motion and the second end of its range of motion, the portion of the target area to which the electromagnetic radiation is directed (e.g., the portion on which the electromagnetic radiation is incident) moves between the first end of the target area and the second end of the target area.

Figure 3H:
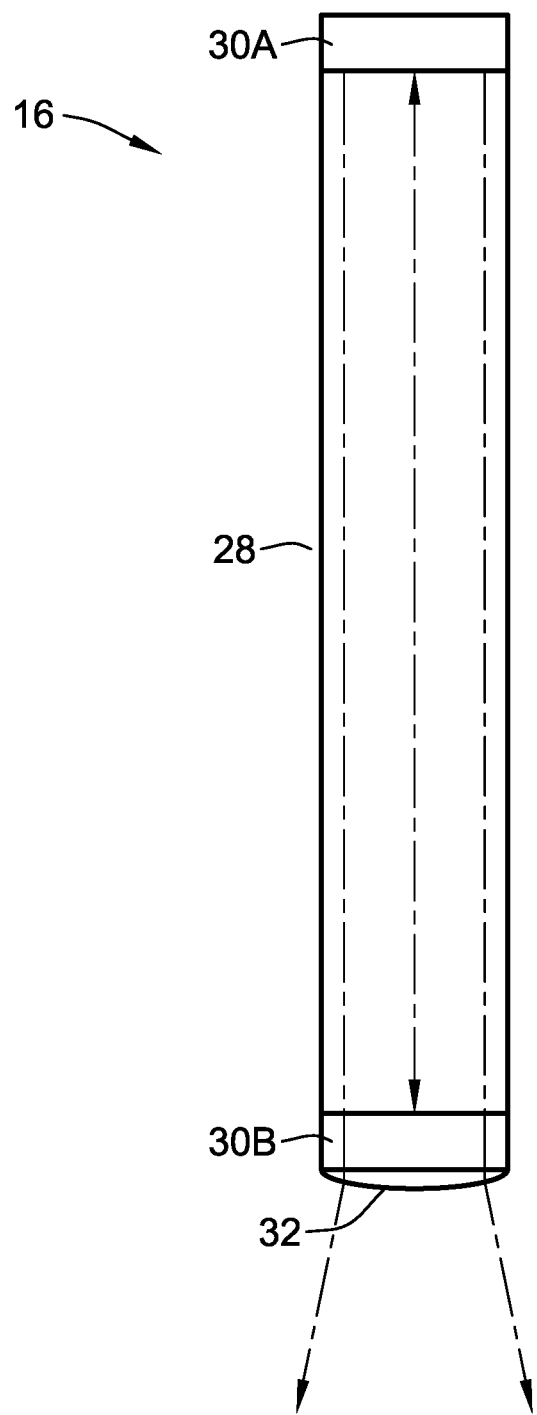
FIG. 3H is a top cross-sectional view of an implementation of a laser for use with the system of FIG. 1A, according to aspects of the present disclosure.

FIG. 3H illustrates yet a further implementation for forming the desired beam shape. FIG. 3H illustrates the laser 16, which is formed from a cavity 28 bounded by two reflective end pieces 30A, 30B. End piece 30B is only partially reflective, such that the electromagnetic radiation can escape through end piece 30B. Laser 16 also includes a convex lens 32 coupled to end piece 30B, such that the electromagnetic radiation emitted by the laser diverges to a desired size. This resulting cone of electromagnetic radiation can be directed as needed toward the target area of the inner surface of the housing 102 of the roasting chamber. The various aspects of the laser and the convex lens can be selected as needed to result in a cone of electromagnetic radiation having the desired beam width.

While specific implementations are shown herein, generally any combination of optical components can be used to create a desired beam shape for roasting the coffee beans. These optical components can include lenses, mirrors, mirror galvanometers (e.g., movable mirrors that can be used to steer a laser beam), etc. The various implementations of the first stage can emit a single cone of electromagnetic radiation toward the target area, or multiple cones. These cones of electromagnetic radiation can generally be configured to be emitted in any direction towards any portion of the interior of the rotating drum of the first stage. Further, any of the optical components can be placed on galvanometers as needed, so that the movement of the optical components can be precisely controlled.

As is shown in FIGS. 3A-3G, the optics arm 104 can include a number of different instruments and/or sensors 114A-114E for measuring various different properties of the roasting chamber 100. These instruments and/or sensors 114A-114E can include thermal imaging devices, high speed cameras, temperature sensors, humidity sensors, spectrophotometers, audio sensors, etc. While five different instruments and/or sensors 114A-114E are shown in each of FIGS. 3A-3G, the optics arm 104 can include any number (include zero) of the instruments and/or sensors detailed in the present disclosure, or any other additional instruments and/or sensors that may be necessary.

In some implementations, the roasting chamber may have a dual configuration that utilizes two rotating drums side-by-side. These rotating drums can each have a portion of them removed so that they sit flush with each other along an extended line, and such that the coffee beans can move from one drum to the other drum. The drums can have internal wipers to move the coffee beans.

Figure 4B:
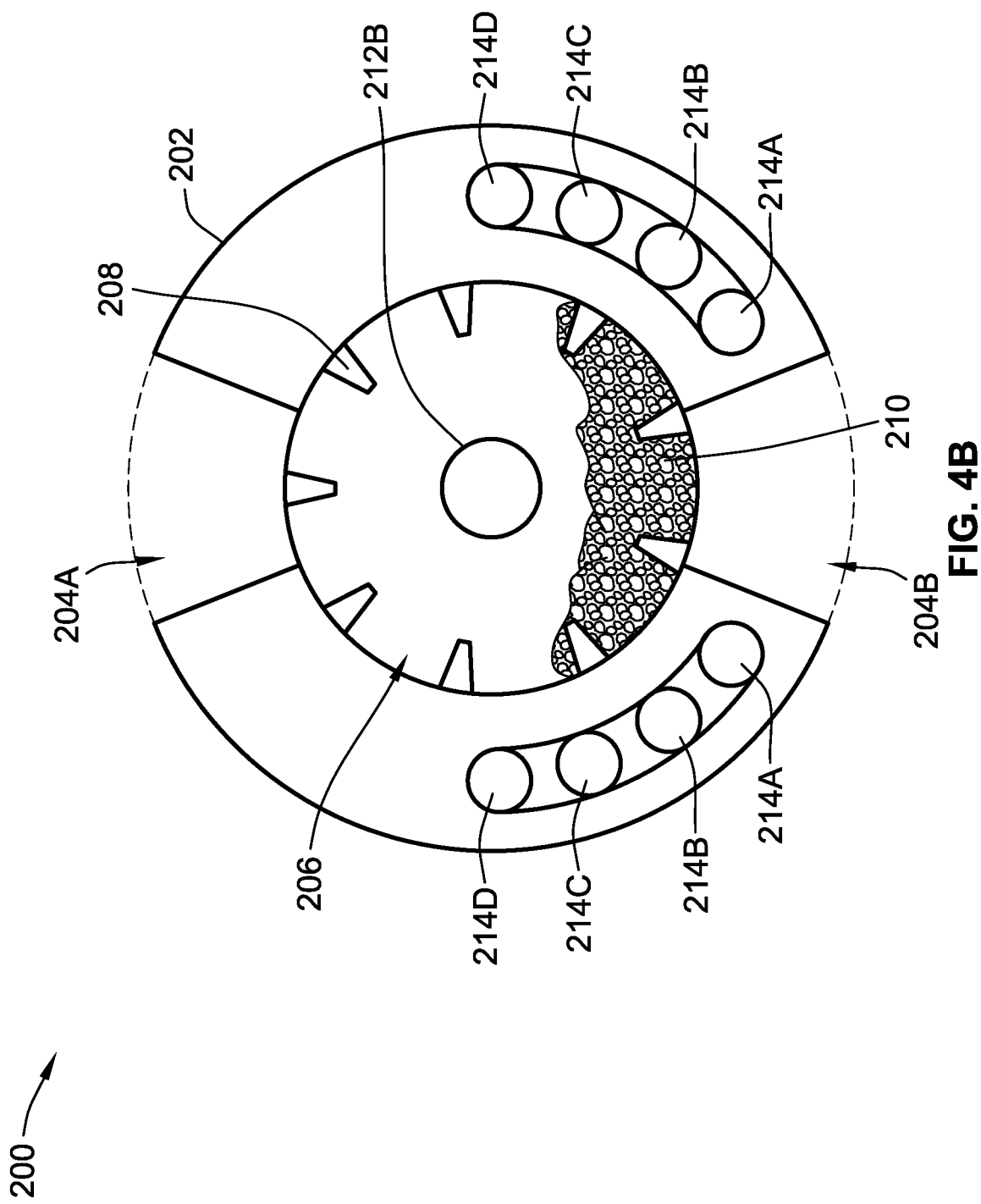
FIG. 4B is an end cross-sectional view of a first implementation of the cooling vessel of FIG. 4A, according to aspects of the present disclosure.

FIG. 4A shows a perspective view of a cross-section of a first implementation of the cooling vessel 200. FIG. 4B shows and end view of the cross-section of FIG. 4A. As shown, cooling vessel 200 is formed from a housing 202 that defines an inner cavity 206. The housing 202 includes an inlet 204A and an outlet 204B. Roasted beans 210 from the roasting chamber 100 enter the housing 202 via the inlet 204A. The cooled beans 210 exit the cooling vessel via the outlet 204B. In some implementations, the housing 202 includes controllably doors that can selectively open and close one or both of the inlet 204A or the outlet 204B. A plurality of fins 208 are defined on the inner surface of the housing 202. The fins 208 extend radially inward from the inner surface of the housing 202. The cooling vessel 200 is configured to rotate, and the fins 208 are configured to carry the beans around the interior of the cooling vessel 200, similar to the roasting chamber 100.

Windows 212A are defined in the side of the housing 202. While windows 212A are only shown on one side of the housing 202, the housing 202 can have additional alternative windows defined at any position or location in the housing 202. The windows allow air to flow into the housing 202, to aid in cooling the roasted beans. The warmed air can then exit through a central air exit pipe 212B.

The housing 202 further includes two sets of cooling pipes 214A-214D that are configured to carry a refrigerant/cooling fluid within the housing 202, to aid in cooling the roasted beans. The cooling pipes 214A-214 can form a snake-like pattern within the housing 202. Generally, the cooling fluid can enter through pipe 214A, travel along pipes 214A, 214B, 214C, and 214D, and then exit the housing 202 through pipe 214D. While two sets of cooling pipes 214A-214D are shown, the cooling vessel 200 can have any number of cooling pipes to carry the cooling fluid. Further, any configuration of cooling pipes can be used. Thus, while FIGS. 4A and 4B show a repeating snake-like pattern, other patterns can also be used. For example, the cooling pipes could extend in a coil-like pattern that continually loops around in a circumferential direction within the housing 202. After the coffee beans have finished cooling and curing, they can exit the cooling vessel 200 and be stored for further processing. The result of the coffee beans' passage through the cooling vessel 200 is to have cooled and cured coffee beans with a predicted sugar content.

Figure 5A:
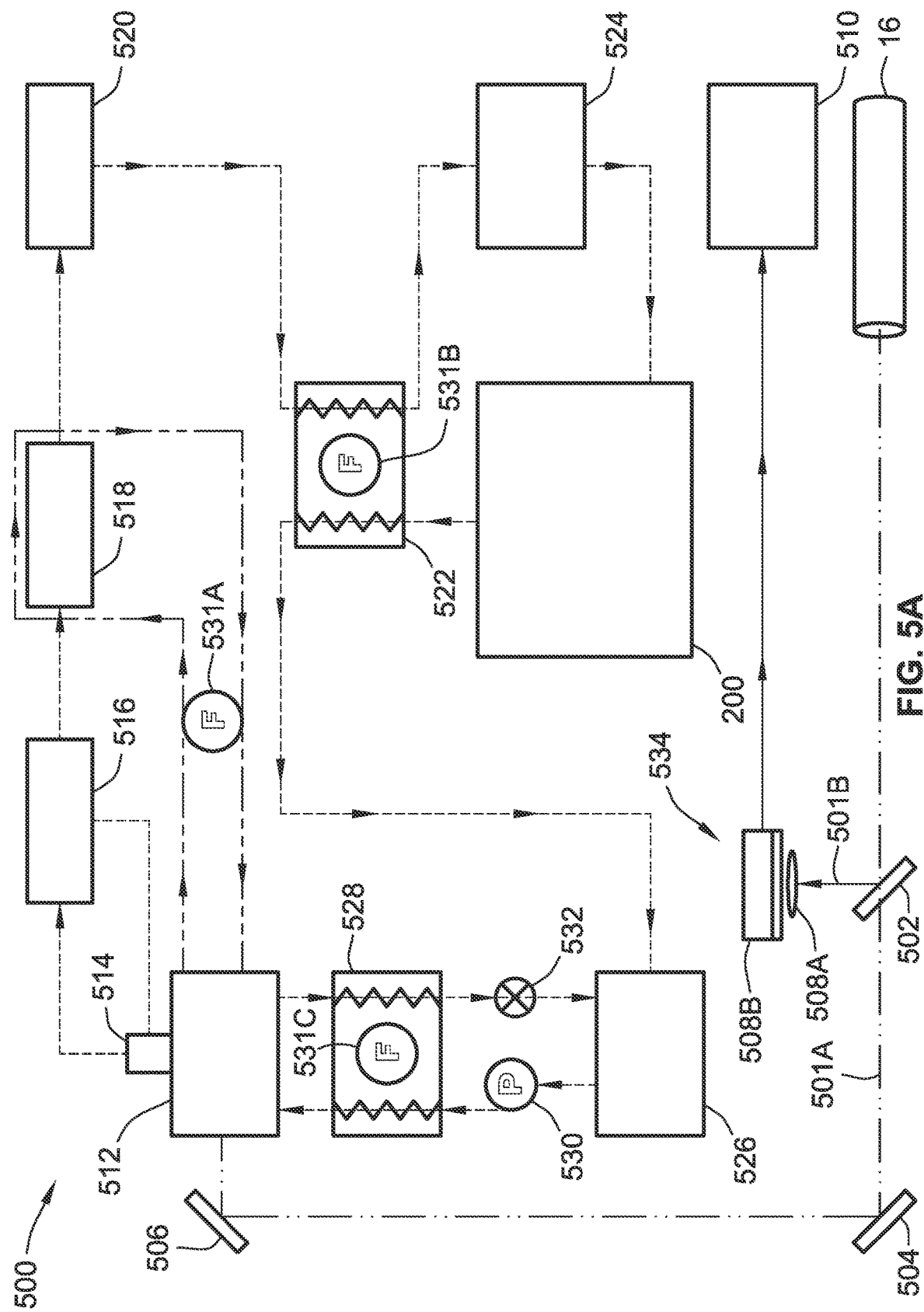
FIG. 5A is a diagram of a cooling system for use with the system of FIG. 1A, according to aspects of the present disclosure.

FIG. 5A shows an example cooling system 500 that can be used with the cooling vessel 200. The cooling system 500 in FIG. 5A is generally known as an absorption cooler or absorption chiller. Generally, a mixture of liquid water and liquid ammonia (e.g., a mixture of $H_2O$ and $NH_3$) is located within an internal cavity of a generator 512. This mixture can be heated by electromagnetic radiation from the laser 16. Beam splitter 502 and mirrors 504 and 506 can be used to direct the electromagnetic radiation from the laser 16 to the generator 512 as needed. As the electromagnetic radiation heats up the mixture in the generator 512, the liquid mixture evaporates into a gas mixture, which travels through a gas analyzer 514 and a rectifier 516. The gas analyzer 514 can analyze the amount of water in the evaporated mixture, and the rectifier 516 can aid in separating the water from the ammonia in the gas mixture. The evaporated water is then sent back to the generator 512.

The ammonia gas is then sent to a condenser 518, where the ammonia gas cools down and begins to condense back to liquid form. A fan 531A aids in removing heat from the condenser 518 and returning the heat to the generator 512. The liquid ammonia then passes through a receiver 520, a heat exchanger 522, and an expansion device 524. These components also aid in removing heat from the ammonia, and ensuring that the ammonia leaving the expansion device 524 contains as much liquid as possible, e.g., aids in converting as much of the ammonia gas to liquid ammonia as possible.

The liquid ammonia then enters the cooling vessel 200 (for example via cooling pipes 214A), where it is aids in cooling the roasted beans by removing heat from the roasted beans. The heated liquid ammonia exits the cooling vessel (for example via cooling pipes 214D), and travels back to the heat exchanger 522. A fan 531B in the heat exchanger 522 aids in transferring heat from (i) the cooled liquid ammonia yet to enter the cooling vessel 200, to (ii) the heated liquid ammonia exiting from the cooling vessel 200. The heated liquid ammonia then travels to an absorber 526. The absorber 526 contains the liquid water returned from the rectifier 516, which passes through heat exchanger 528 and check valve 532. The liquid ammonia from the heat exchanger 522 mixes with the liquid water in the absorber 526. A pump 530 pumps the water/ammonia mixture from the absorber 526 through heat exchanger 528. A fan 531C in the heat exchanger 528 aids in transferring heat from the water/ammonia mixture traveling to the generator 512, to the water returning from the generator 512. Thus, the heat exchanger 528 aids in ensuring that the water/ammonia mixture in the generator 512 is cooled down, and thus has the capacity to be heated by the laser 16.

As is shown in FIG. 5A, a portion of the electromagnetic radiation from the laser 16 passes through beam splitter 502 toward mirror 504. However, another portion of the electromagnetic radiation from the laser 16 is reflected by the beam splitter 502 toward a photovoltaic power generation unit 534, which is formed from a diverging lens 508A and a cobalt-doped zinc oxide film. The diverging lens 508A causes the electromagnetic radiation to diverge, such that the electromagnetic radiation is incident on as large of a portion of the surface of the cobalt-doped zinc oxide film 508B as possible. The electromagnetic radiation incident on the film 508B causes a current to flow, which can then be used to power some or all of the other components of the system, denoted as 510.

FIGS. 5B and 5C illustrate the generator 512. As shown, the generator 512 includes a housing 513 which contains triangular mirror 544, reflective baffles 546A-546C, and reflective baffles 547A-547C. The housing 513 contains the water/ammonia mixture. The housing 513 also includes a window 542 (which could be a zinc-selenium window) through which the electromagnetic radiation from the laser 16 passes through. The mirror 544 causes the electromagnetic radiation to reflect to the left and the right within the housing 513. The electromagnetic radiation reflected to the left can continually reflect off of reflective baffles 546A-546C and the mirror 544. The electromagnetic radiation reflected to the right can continually reflect off of reflective baffles 547A-547C and the mirror 544. The electromagnetic radiation thus propagates through the housing 513, reflecting off of the mirror 544, the reflective baffles 546A-546C, and the reflective baffles 547A-547C, thereby heating the water/ammonia mixture. The generator 512 also includes outlets 540A and 540B. to allow the various fluids described in connection with FIG. 5A to enter and exit the generator 512.

Figure 6A:
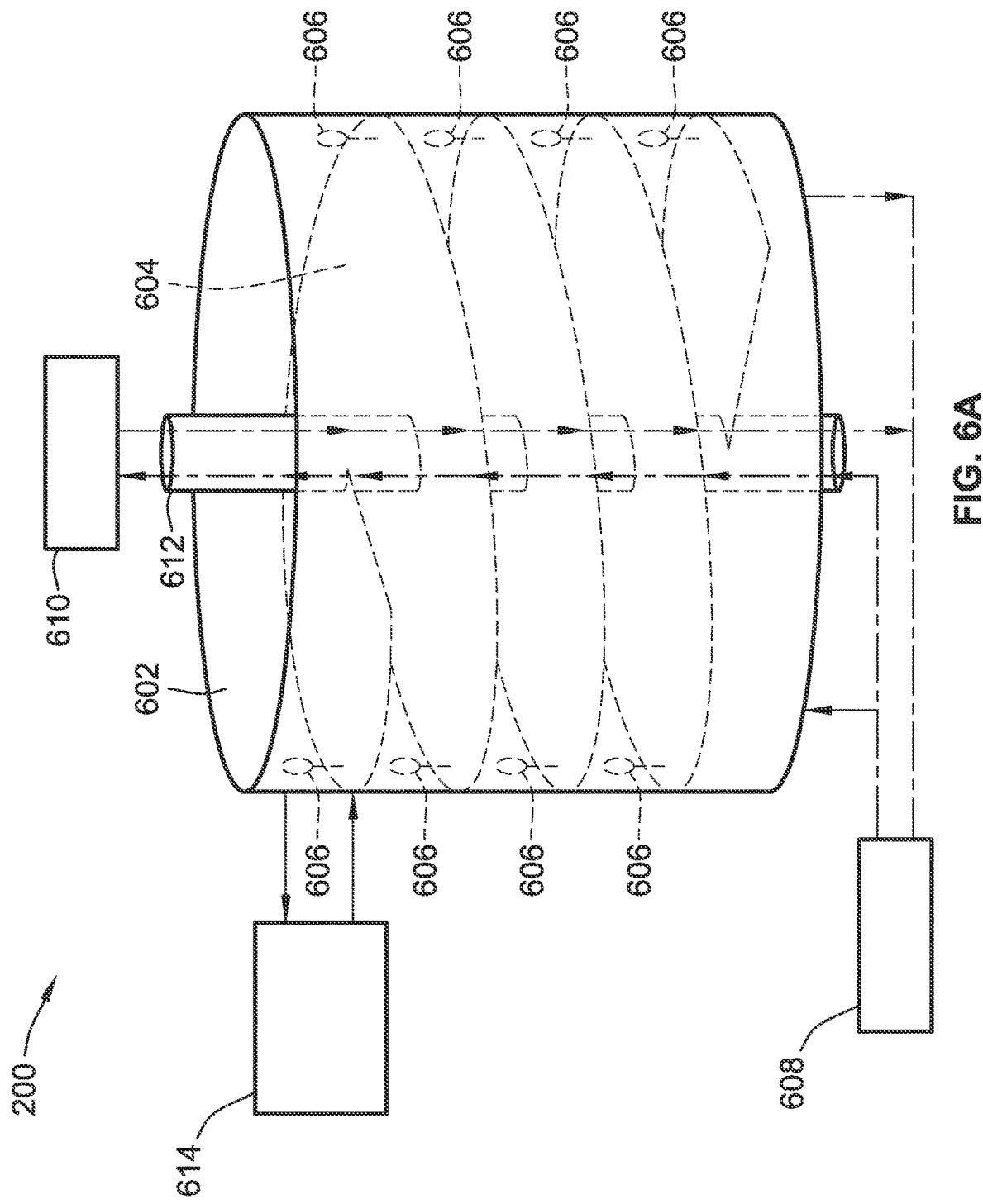
FIG. 6A is a perspective view of a second implementation of a cooling vessel for use with the system of FIG. 1A, according to aspects of the present disclosure.

FIGS. 6A and 6B illustrate another implementation of the cooling vessel 200. Here, the cooling vessel 200 is a screw conveyor that is formed from a helical screw blade 604 positioned within a housing 602. After the coffee beans are done roasting, they are moved to the cooling vessel 200. The helical screw blade 604 of the screw conveyor moves the roasted coffee beans through the housing 602 of the cooling vessel 200. In some implementations, the helical screw blade 604 acts as an agitator of the coffee beans. The speed and direction of the helical screw blade 604 can be controlled and modified as needed. In some implementations, the coffee beans generally pass from an entrance to an exit of the housing 602, e.g., they make one "trip" through the cooling vessel 200. In other implementations, the coffee beans make multiple "trips" through the cooling vessel 200.

The cooling vessel 200 also includes some type of fluid path through which a cooling fluid is piped. The cooling fluid is used to cool and cure the roasted coffee beans. In some implementations, the cooling fluid is a refrigerant. Other implementations may use other types of cooling fluids. For example, the cooling fluid can be the ammonia from the cooling system 500 of FIG. 5A. The fluid path can be pipes, tubing, molding, or generally any structure that can carry the cooling fluid. As shown, a pump 608 can be used to pump the cooling fluid into the housing 602, and also into a central tube 612. In some implementations, the cooling fluid within the housing 602 follows the helical path of the coffee beans as they are moved by the helical screw blade 604. The cooling vessel 200 can also include a heating, ventilation, and air conditioning (HVAC) control system 610 can be used to control the flow of the cooling fluid through the fluid path. Other mechanisms can also be used to control the flow of the cooling fluid.

In some implementations, the cooling vessel 200 has a cylindrical shape. Other shapes can also be used. As shown, the cooling vessel 200 may include a number of temperature sensors 606, such as thermistors. These temperature sensors 606 are used to monitor the temperature within the cooling vessel 200 to ensure the roasted coffee beans are cooled and cured properly. In some implementations, the cooling vessel 200 is capable of maintaining a temperature that is substantially lower than the temperature to which the beans are cooled to. The cooling vessel 200 may also include a number of humidity sensors or other types of sensors. The curing rate can be controlled to ensure that the coffee beans are not over-cured or under-cured, in part by monitoring the resultant gasses. The resultant gasses can be sent to a gas analyzer 614 to monitor the cooling/curing process. After the coffee beans have finished cooling and curing, they can exit the cooling vessel 200 and be stored for further processing. The result of the coffee beans' passage through the cooling vessel 200 is to have cooled and cured coffee beans with a predicted sugar content. Generally, any aspects of the cooling vessel 200 shown in FIGS. 4A, 4B, 6A, and 6B can be combined.

Figure 7A:
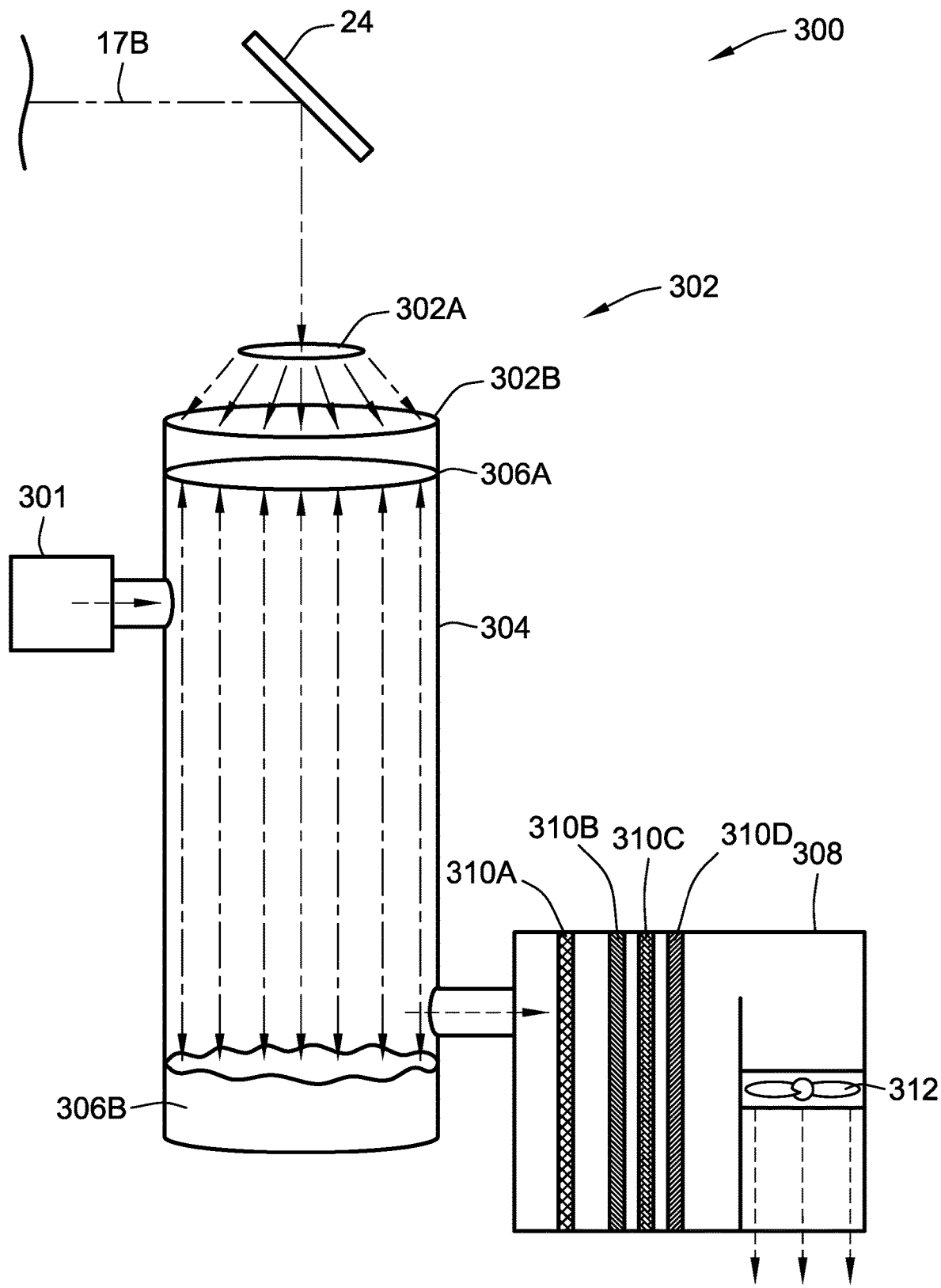
FIG. 7A a is a diagram of an incineration vessel for use with the system of FIG. 1A, according to aspects of the present disclosure.

FIG. 7A shows one implementation of the incineration vessel 300. The incineration vessel 300 is formed from a generally airtight housing 304 that receives air from the roasting chamber 100 via connection 301. The second beam 17B of electromagnetic radiation from the laser 16 can be directed toward the housing 304 via mirror 24. The electromagnetic radiation can pass through the collimating optics 302, which include a beam expander 302A and a collimator 302B. The collimated electromagnetic radiation then enters the housing 304, which can be formed from a reflective material so that the electromagnetic radiation within the housing 304 reflects back and forth within the housing 304, essentially trapping the beam of electromagnetic radiation in the housing 304. For example, the housing 304 can include reflective end pieces 306A, 306B that reflect the electromagnetic radiation within the housing 304. In some implementations, some or all of the interior of the housing 304 is made of polished copper.

In the interior of the housing 304, the electromagnetic radiation contacts the particulate matter that has been piped over from the roasting chamber 100. The electromagnetic radiation incinerates this particulate matter. The air within the housing 304 can then be vented through a scrub box 308, which can contain filtering components 310A-310D. These filtering components 310A-310D can include ionizers, HEPA (high-efficiency particulate air) filters, or other components. The filtering components 310A-310D the air after incineration. The air is then vented out of the scrub box 308, for example using a fan 312.

Figure 7B:
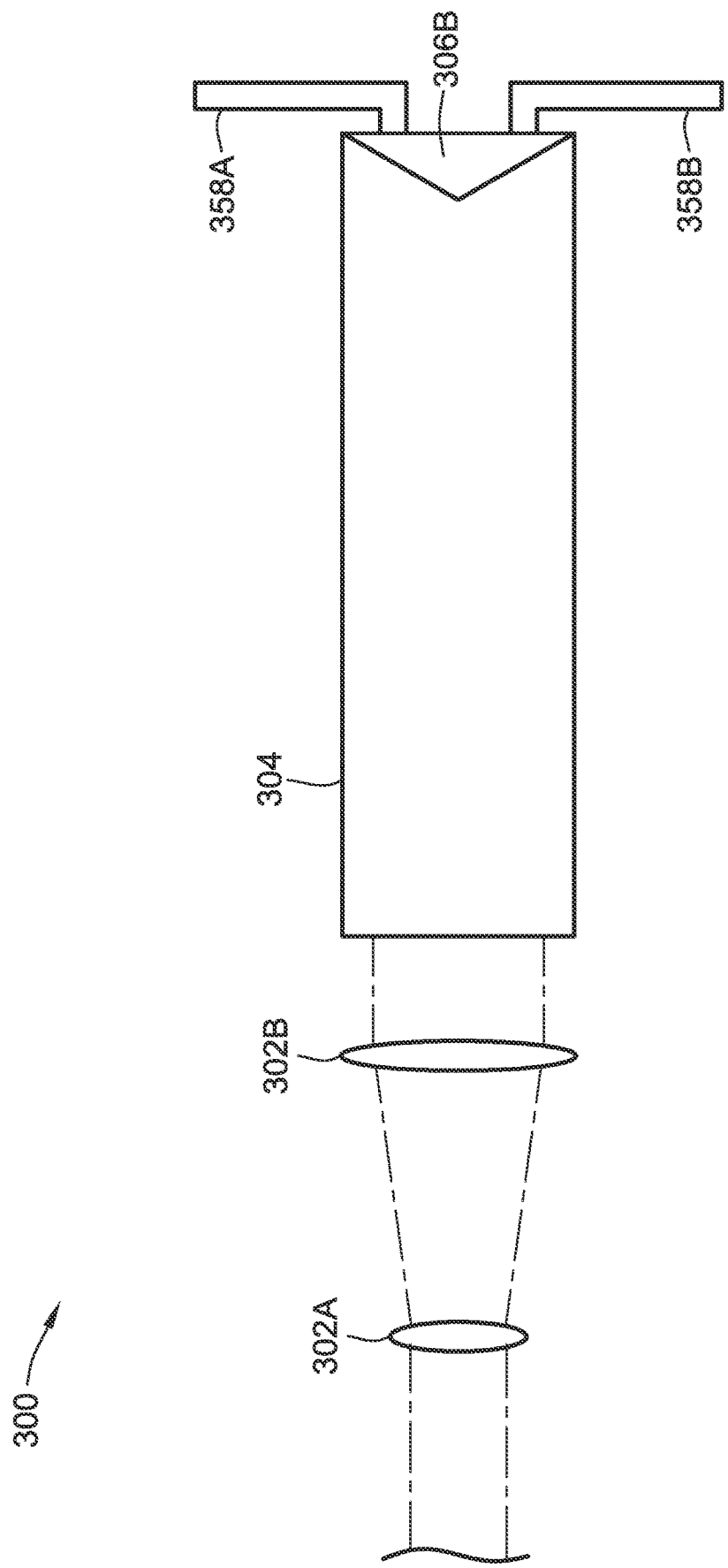
FIG. 7B is an additional diagram of the incineration vessel of FIG. 7A, according to aspects of the present disclosure.

FIG. 7B shows another implementation of the incineration vessel 300 including the beam expander 302A, the collimator 302B, and the reflective end piece 306B. In this implementation, the reflective end piece 306B has a triangular shape, which aids in ensuring that the reflected electromagnetic radiation within the housing 304 propagates over as much of the volume of the interior of the housing 304 as possible. The incineration vessel 300 can also include a cooling inlet 358A and a cooling outlet 358B, which can be used to carry cooling fluid into and out of the housing 304, to aid in keeping the incineration vessel 300 cool during use, and removing heat from the air and particulate matter sent to the incineration vessel 300 from the roasting chamber 100. Thus, in some implementations, the incineration vessel 300 can be coupled to a cooling system, such as cooling system 500 illustrated in FIG. 5A. Generally, any aspects of the incineration vessel 300 shown in FIGS. 7A and 7B can be combined.

Figure 8:
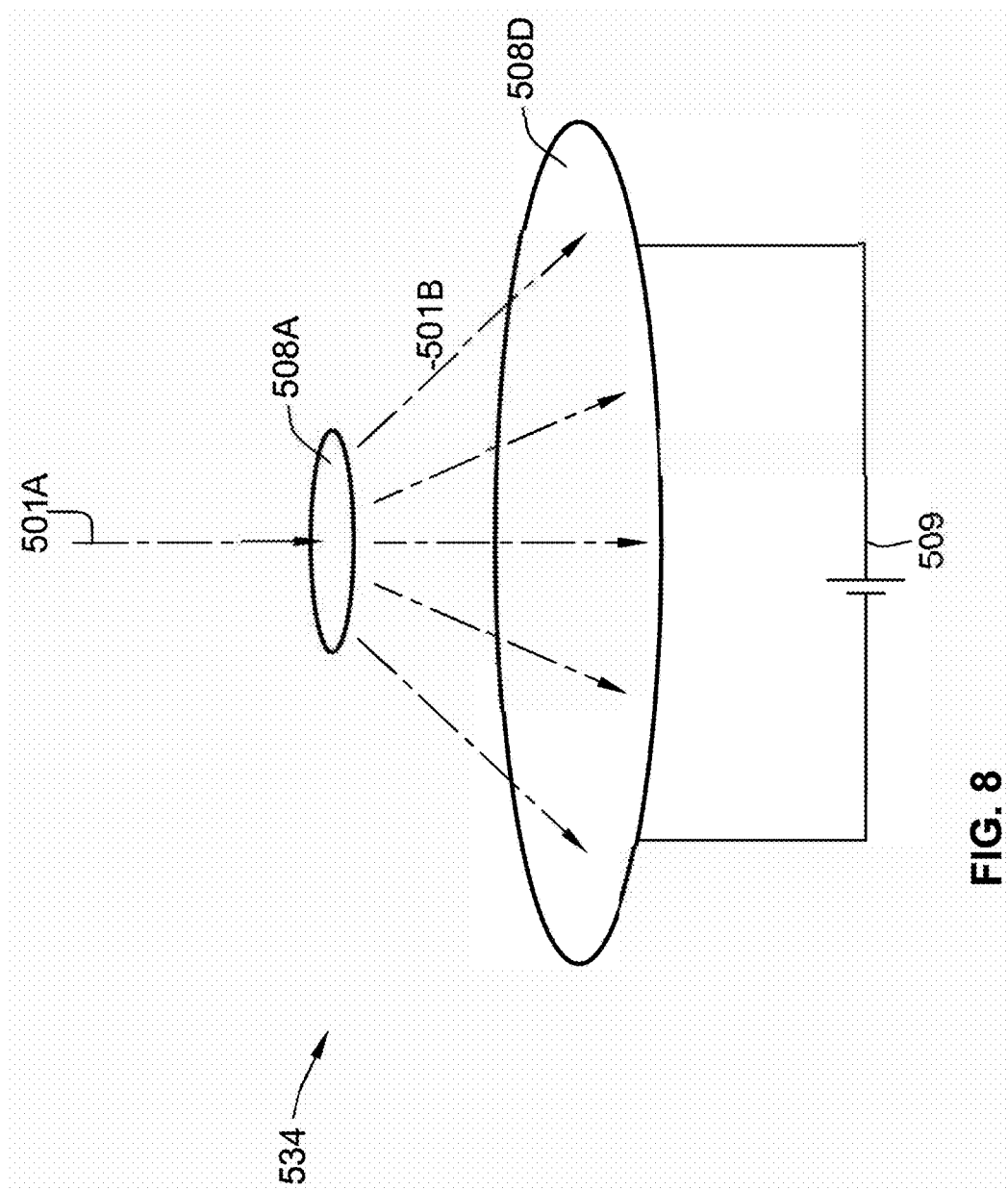
FIG. 8 is a view of a photovoltaic power generation unit for use with the system of FIG. 1A, according to aspects of the present disclosure.

FIG. 8 shows the photovoltaic power generation unit 534. As shown, the photovoltaic power generation unit 534 includes a beam expander 508A and a semiconductor film 508D. In some implementations, the semiconductor film is a cobalt-doped zinc-oxide film. The beam expander 508A expands the beam of electromagnetic radiation 501A, such that as much of the surface area of the semiconductor film 508D is struck by the beam of electromagnetic radiation 501B as possible. The semiconductor film 508D can be electrically connected to a pair of electrical contacts or wires, such that a voltage 509 is formed between the pair of electrical contacts. Generally, the photovoltaic power generation unit 534 can be used to power any one or more of the components of system 10.

System 10 as shown in FIGS. 1A and 1B is generally a vertically-oriented system where the beans travel vertically between the cylindrical roasting chamber 100 and the cylindrical cooling vessel 200 via gravity. In some implementations, the inlet 14A of the housing 12 is aligned with an inlet of the roasting chamber 100, so that the unroasted beans fall from the load hopper into the roasting chamber 100 through the inlet. An outlet of the roasting chamber 100 is aligned with an inlet of the cooling vessel 200 (such as inlet 204A of the cooling vessel 200 in FIGS. 4A and 4B, or an inlet defined in the housing 602 of the cooling vessel 200 in FIGS. 6A and 6B), so that the roasted beans can fall from the roasting chamber through the outlet, and into the cooling vessel 200 through the inlet. The outlet 14B of the housing 12 can be aligned with the outlet of the cooling vessel 200, so that the cooled beans travel from the cooling vessel 200 through the outlet of the cooling vessel 200, and then out of the outlet 14B of the housing 12. In some implementations, the system 10 includes a load hopper coupled to the inlet 14A that holds the beans as they enter the roasting chamber 100. In some implementations, the system 10 includes a discharge hopper coupled to the outlet 14B that collects the beans after they exit the cooling vessel 200. Moreover, in some implementations, any housing or housings of the system 10 can be partially or fully transparent, to allow viewing of the beans during the roasting process, and/or allow viewing of any other steps of components.

In other implementations, system 10 may be horizontally-oriented and utilize linear or near-linear conveyor belts that transport the beans from the inlet 14A to the outlet 14B. In these implementations, the conveyor belts can extend through the roasting chamber 100 and the cooling vessel 200 to carry the beans through the roasting chamber 100 and the cooling vessel 200. Other types of transportation mechanisms can also be used, and other configurations or shapes of the system or the various components of the system can be used.

Figure 9:
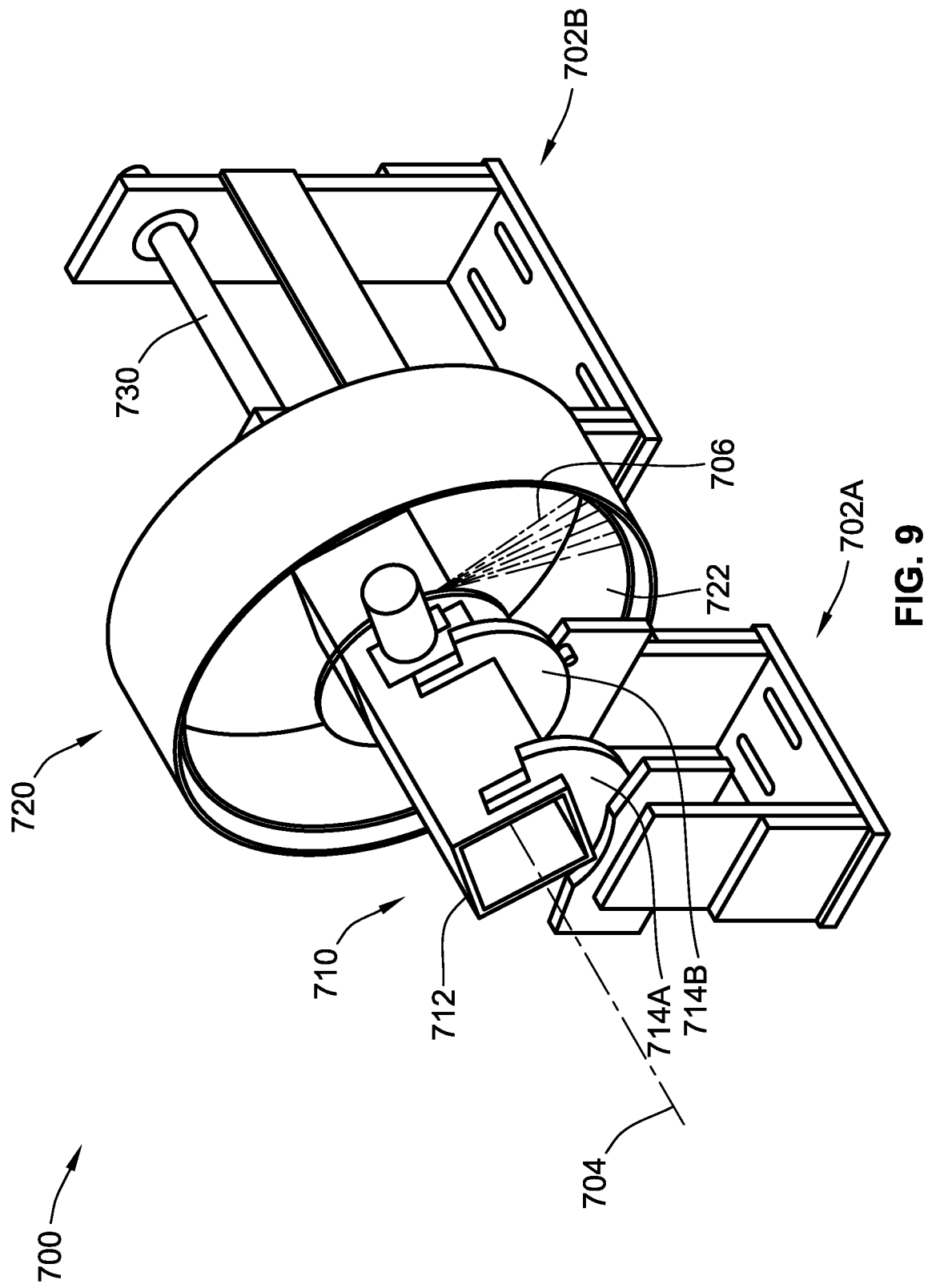
FIG. 9 is a partial perspective view of a system for roasting coffee beans, according to aspects of the present disclosure.

FIG. 9 shows a perspective partial view of a system 700. System 700 is generally similar to system 10, but is designed as a horizontally-oriented system, where the beans (or other objects) travel in a general horizontal direction through the system 700. System 700 includes frame pieces 702A and 702B, an optics arm 710, a roasting chamber 720, and an axle 730. Frame piece 702A is configured to support the optics arm 710, while frame piece 702B is configured to support the roasting chamber 720 and the axle 730. The optics arm 710 includes a housing 712, and two disc-shaped members 714A and 714B that are both mounted on the frame piece 702A. An incoming beam 704 of electromagnetic radiation is generated by a laser (not shown) and directed toward the optics arm 710, which may include the necessary optical components disposed therein. The optical components are configured to cause a beam 706 of electromagnetic radiation to be emitted from the optics arm 710 and be incident onto a target area of an inner surface 722 of the roasting chamber 720. During operation, the beans will be located within the roasting chamber 720, such that the beam 706 is incident on the beans. Generally, system 700 will include additional structures or components that hold the laser, and direct some or all of the electromagnetic radiation from the laser to the optics arm 710.

The optics arm 710 can be rotated on the disc-shaped members 714A and 714B relative to the frame piece 702A, in order to direct the beam 706 of electromagnetic radiation as desired on the inner surface 722 of the roasting chamber 720. The system 700 will generally include some type of mechanism that is configured to control the rotation of the optics arm 710, such as a servo motor or other actuator(s). In the illustrated implementations, the optics arm 710 includes a protrusion 718 extending from the optics arm 710. The system 700 can include additional structures that contact and/or move the protrusion 718, in order to rotate the optics arm 710.

The axle 730 is fixedly coupled to the roasting chamber 720. The axle 730 can be rotated (for example by a servo motor or other actuator(s)), which in turn causes the roasting chamber 720 to rotate. The roasting chamber 720 can include a number of inwardly-pointing fins (similar to fins 108 of roasting chamber 100) that carry the beans as the roasting chamber 720 rotates. During rotation of the roasting chamber 720, the fins will carry beans upward, and the beans will then eventually fall back down to the target area where the beam 706 is incident. Thus, the rotation of the roasting chamber 720 ensures that all of the beans in the roasting chamber 720 will spend a sufficient amount of time within the target area on the inner surface 722, as discussed herein with respect to FIGS. 2A and 2B. During operation of system 700, an individual bean will repeatedly pass in and out of the target area as the roasting chamber 720 rotates. In some implementations, the axle 730 rotates continuously during the roasting process. In other implementations, the axle 730 can be rotated in a start-and-stop fashion, as may be required by the specific roasting process being used.

Generally, the system 700 will include additional components or structures that are not illustrated in FIG. 9. For example, the system 700 will generally include a housing over one or more of the components illustrated in FIG. 9. The roasting chamber 720 may include a housing that encloses the roasting chamber 720. Additionally or alternatively, there may be an additional housing that encloses the entire system. In implementations with multiple housing, the housing enclosing the roasting chamber 720 can be used to prevent beans from spilling out into other portions of the system, and the housing enclosing the entire system 700 can be used to protect all of the components of the system 700. In some implementations, any one or more housing of the system 700 can be partially or fully transparent, to allow viewing of the beans during the roasting process, and/or allow viewing of any other steps of components.

System 700 will generally also include any required structure(s) or mechanism(s) to cause the beans (or other object being roasted) to move through the system 700. For example, any housing or housings of the system 700 may include an inlet (and/or a load hopper) via which beans can be deposited into the roasting chamber 720. The system 700 can include a conveyor belt or other mechanism to transport beans from the roasting chamber 720 to a cooling vessel (which may be the same as or similar to cooling vessel 200), and from the cooling vessel out of the system 700 through an outlet in the housing (and/or a discharge hopper).

The system 700 can also include an incineration vessel (which can be mounted on or otherwise coupled to one or both the frame pieces 702A and 702B, or to other structures). The incineration vessel can be similar to the incineration vessel 300. The system 700 may also include mechanisms to vent air and particulate matter from the roasting chamber 720 to the incineration vessel. In some implementations, the entirety of system 700 is enclosed, except for any required access points or openings, such as openings for adding beans to the system 700, openings for receiving beans after the roasting process is completed, openings to provide maintenance or other services, etc.

Figure 10A:
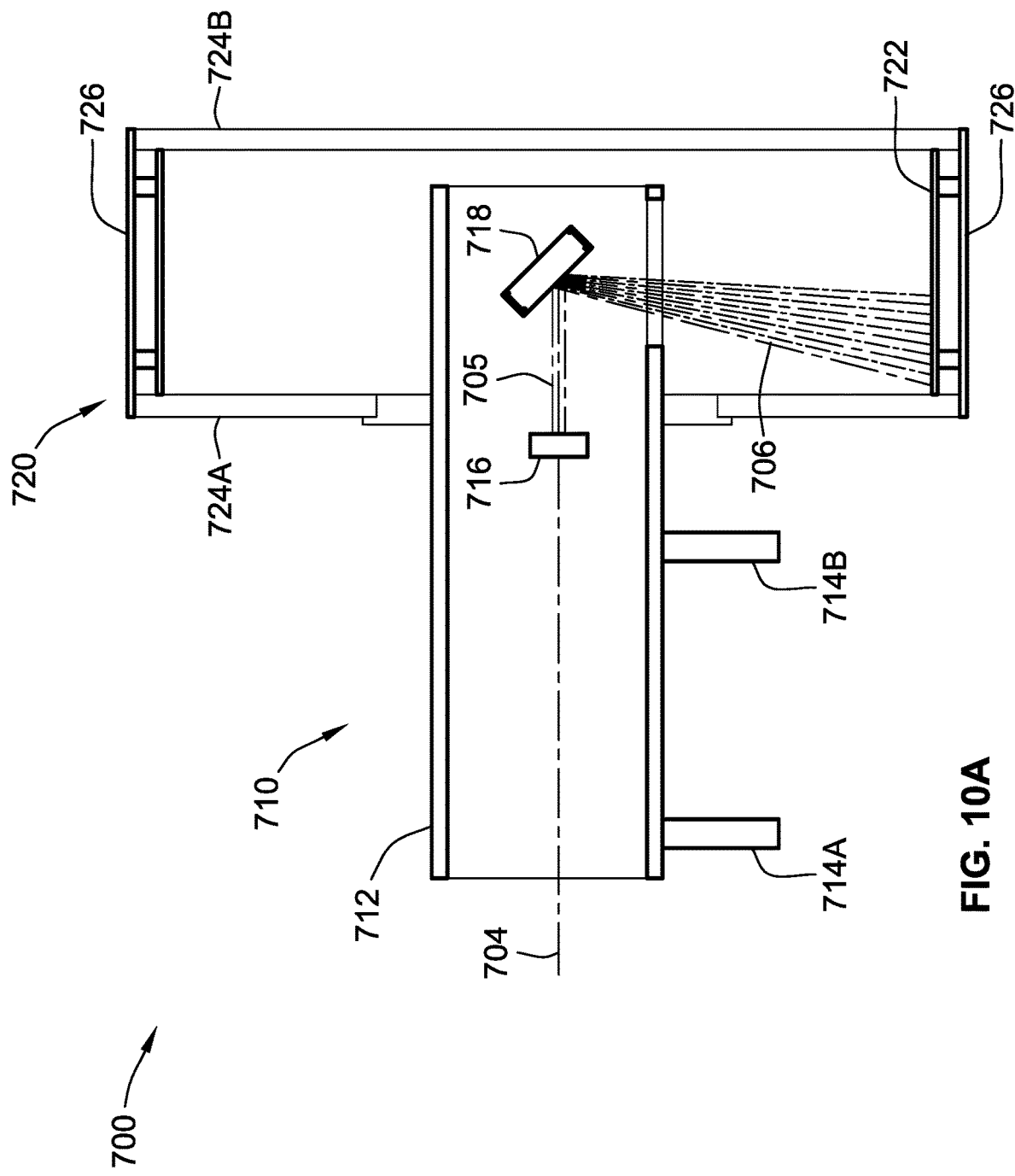
FIG. 10A is a side cross-sectional view of an optics arm of the system of FIG. 9 when a movable mirror is in a first position, according to aspects of the present disclosure.
Figure 10B:
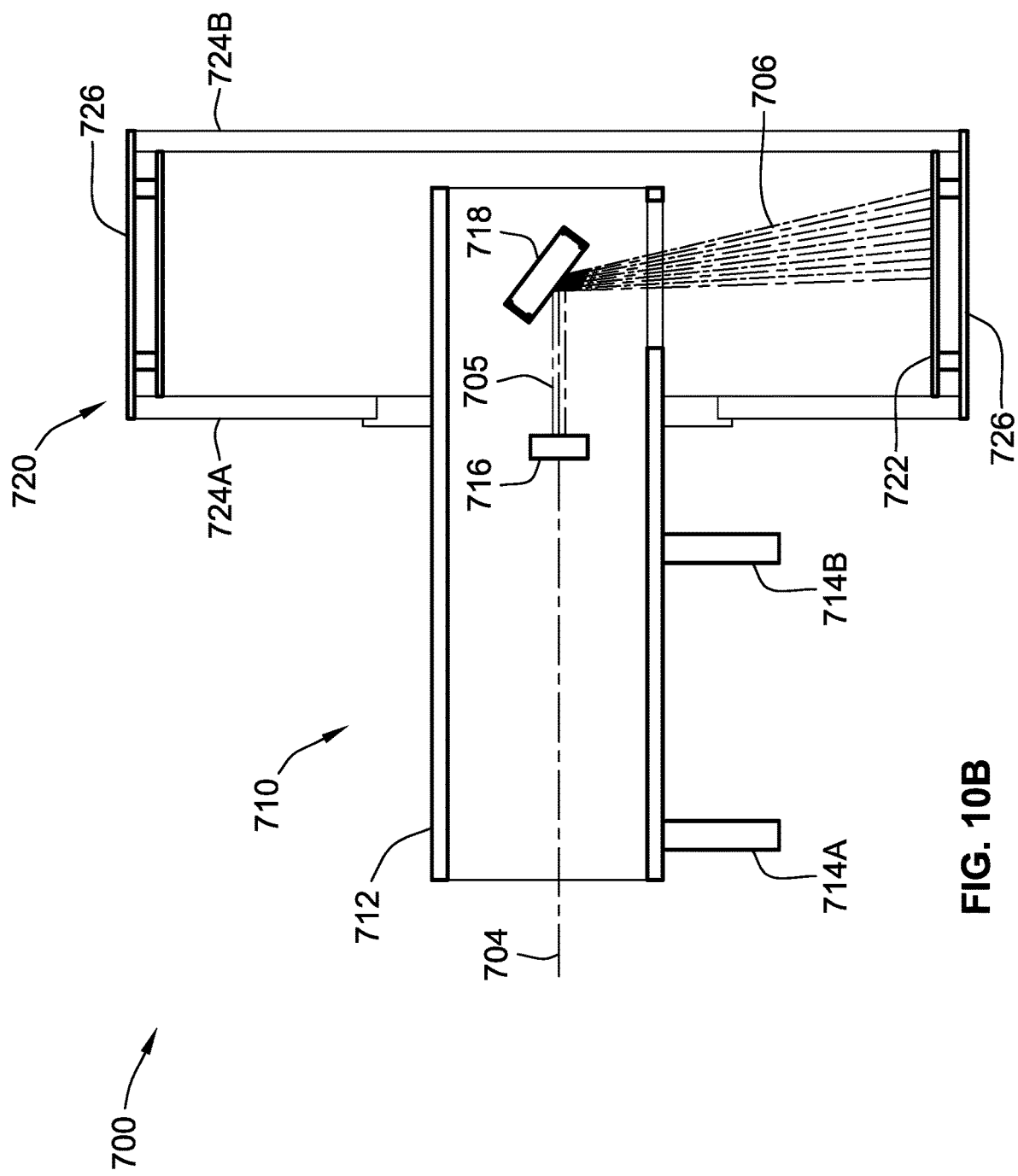
FIG. 10B is a side cross-sectional view of the optics arm of FIG. 10A when the movable mirror is in a second position, according to aspects of the present disclosure.

FIGS. 10A and 10B show a cross-section of the optics arm 710 and the roasting chamber 720. The roasting chamber 720 has two side portions 724A and 724B that are joined by a circumferential piece 726, to form the inner volume of the roasting chamber 720. The target area of the roasting chamber 720 is the inner surface 722 of the circumferential piece 726. The housing 712 of the optics arm 710 extends through the side portion 724A and into the inner volume of the of the roasting chamber 720. The disc-shaped members 714A and 714B of the optics arm 710 are also shown.

The optics arm 710 includes imaging optics 716 and a movable mirror 717 disposed within the housing 712 that are positioned in the path of the incoming beam 704 of electromagnetic radiation. The imaging optics 716 can be any combination of one or more optical components that operate in a desired way on the incoming beam 704 of electromagnetic radiation, similar to FIGS. 3F and 3G. In the illustrated implementation, the imaging optics 716 is configured to broaden the spread of the incoming beam 704 of electromagnetic radiation, and thus could include a beam expander and collimator, or other components. In other implementations however, the imaging optics 716 can include other combinations of optical components that are configured to operate in a different manner on the incoming beam 704 of electromagnetic radiation. In any implementations, a beam 705 of electromagnetic radiation is emitted from the imaging optics 716 and directed toward the movable mirror 717.

The movable mirror 717 (which can be a mirror galvanometer) reflects the beam 705 of electromagnetic radiation through a window 719 formed in the housing 712, and onto the target area of the roasting chamber 720 at the inner surface 722. In FIG. 10A, the mirror 717 is in a first position, and is angled with respect to the beam 705 of electromagnetic radiation so that the beam 706 of electromagnetic radiation is incident on the target area closer to the side portion 724B. In FIG. 10B, the mirror 717 is in a second position, and is angled with respect to the beam 705 of electromagnetic radiation so that the beam 706 of electromagnetic radiation is incident on the target area closer to the side portion 724A. The mirror 717 can be repeatedly moved back and forth so that the beam 706 of electromagnetic radiation sweeps across the full width of the target area (e.g., some or all of the width of the inner surface 722 of the circumferential piece 726, between the side portions 724A and 724B). In some implementations, the width of the target area is the full width of the inner surface 722 between the side portions 724A and 724B. In other implementations, the width of the target area is a portion of the full width of the inner surface between the side portions 724A and 724B. The imaging optics 716 and/or the mirror 717 can be designed so that the beam 706 of electromagnetic radiation has a desired width when it strikes the target area of the roasting chamber 720.

While the illustrated implementation shows the optics arm 710 extending into the interior of the roasting chamber 720, other implementations of the roasting chamber 720 may not include the optics arm 710 as illustrated. For example, in some implementations, the optics arm 710 may terminate short of the roasting chamber 720, and the electromagnetic radiation from the optics arm 710 can be directed into the roasting chamber 720. In some of these implementations, the roasting chamber 720 includes imaging optics that direct the electromagnetic radiation to the target area. In others of these implementations, the optics arm 710 is positioned relative to the roasting chamber 720 such that the electromagnetic radiation from the optics arm 710 will be incident on the target area without any additional imaging optics.

In further implementations, the roasting chamber 720 may not include the optics arm 710 at all. Instead, an electromagnetic radiation source (which could be a variety of different types of lasers, including a fiber laser) may be disposed outside or inside the roasting chamber 720. Electromagnetic radiation from the electromagnetic radiation source can be directed to the target area with or without the use of any imaging optics (such as the movable mirror).

While system 10 is generally a vertically-oriented system and system 700 is generally a horizontally-oriented system, some implementations may include a system that is both vertically-oriented and horizontally-oriented. For example, the system in one implementation may include a generally vertically-oriented roasting chamber and a generally horizontally-oriented cooling vessel. The beans can travel through the roasting chamber in a vertical direction (e.g., enter the roasting chamber from the top and exit the roasting chamber from the bottom), but then travel through the cooling vessel in a horizontal direction. The roasting chamber can be similar to the roasting chamber 100 of FIGS. 2A and 2B, and may include an inlet and an outlet at the top and bottom of the hosing of the roasting chamber. In some examples of this implementation, the cooling vessel is similar to the cooling vessel 200 shown in FIGS. 4A and 4B. However, instead of having the beans enter through the top inlet 204A and exit through the bottom outlet out 204B, the inlet and outlet are located on the sides of the roasting chamber, such that the beans travel through the roasting chamber in a horizontal direction. In other examples of this implementation, the cooling vessel is similar to the cooling vessel 200 shown in FIGS. 6A and 6B. However, instead of using the helical screw blade 604 to move beans vertically, the cooling vessel could include one or more horizontal conveyer belts that move the roasted beans through the cooling vessel.

In another implementation, the system includes a generally horizontally-oriented roasting chamber and a generally vertically-oriented cooling vessel. The beans can travel through the roasting chamber in a horizontal direction, but then travel through the cooling vessel in a vertical direction (e.g., enter the cooling vessel from the top and exit the cooling vessel from the bottom as shown in FIGS. 4A, 4B, 6A, and 6B). In some examples of this implementation, the roasting chamber is similar to the roasting chamber 100 shown in FIGS. 2A and 2B, and may include an inlet and an outlet at the sides of the housing of the roasting chamber.

Other configurations of a system for roasting coffee beans (or other objects) can also be used. For example, in some implementations, the system includes only the roasting chamber and the cooling vessel, and does not include the incineration vessel. In other implementations, the system includes only the roasting chamber and the incineration vessel, and not cooling vessel. In further implementations, the system includes only the roasting chamber.

Figure 11:
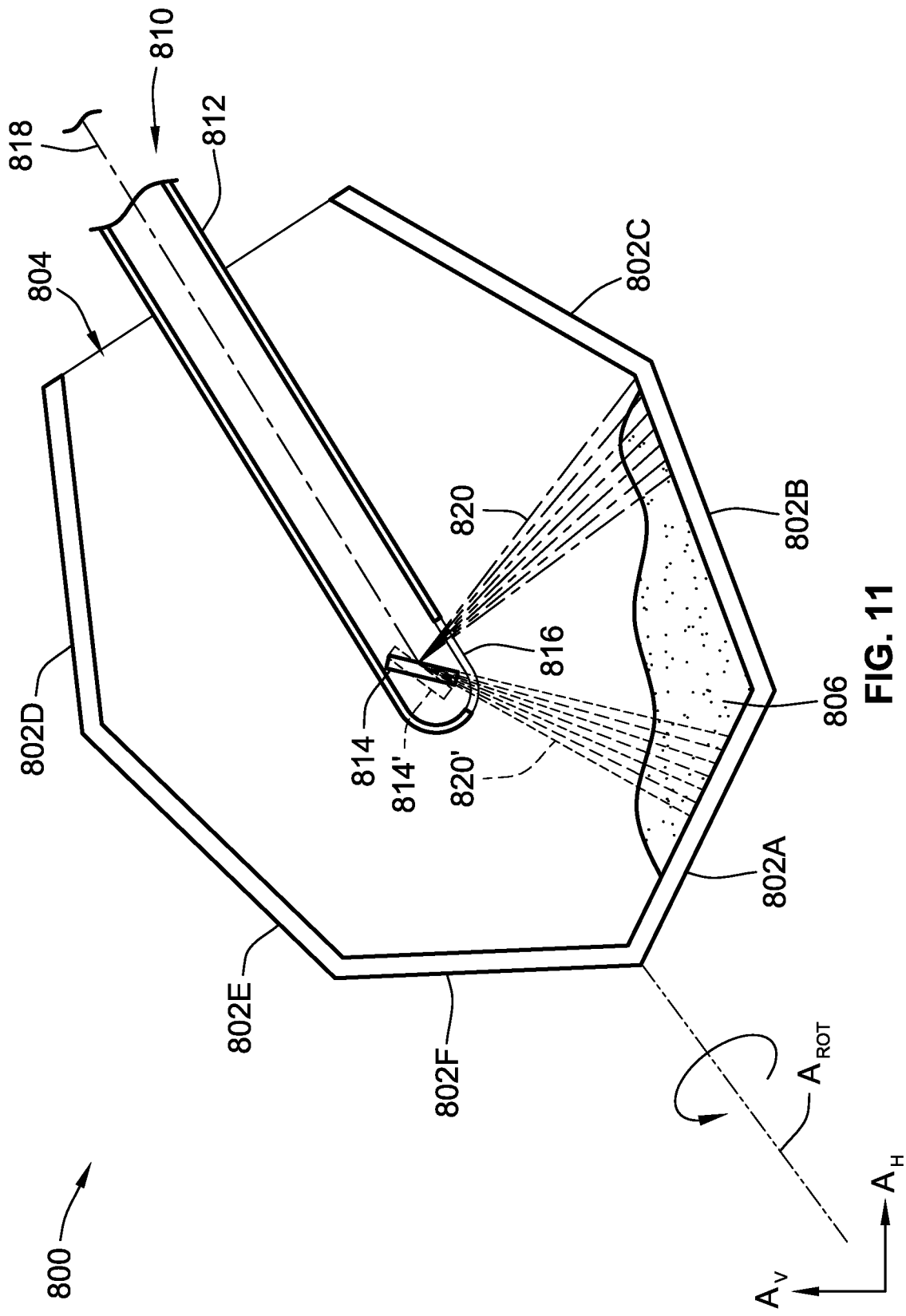
FIG. 11 is a perspective cross-sectional of a tilted roasting chamber, according to aspects of the present disclosure.

FIG. 11 shows a cross-sectional view of a tilted roasting chamber 800. Roasting chamber 800 can be similar to roasting chambers 100 and 720, and can be used with system 10, system 700, or any other system for roasting coffee beans according to the present disclosure (e.g., a horizontal system, a vertical system, a mixed horizontal-vertical system, etc.). In the illustrated implementation, the roasting chamber 800 is formed from three different three-dimensional pieces. Thus, the cross-section of the roasting chamber 800 that is shown in FIG. 11 has six sides 802A-802F, and an opening 804 positioned between sides 802C and 802D. In other implementations, the roasting chamber 800 can be formed from any number of pieces, such that the cross-section can have any number of sides. Other implementations of the roasting chamber 800 can also optionally exclude the opening 804.

The roasting chamber 800 is illustrated in FIG. 11 alongside a horizontal $A_H$ and vertical axis $A_R$. The horizontal axis $A_H$ represents the ground, the thus the vertical axis $A_R$ represents the direction of gravity. As shown, the roasting chamber 800 is oriented relative to the horizontal axis $A_H$, such that the point where sides 802A and 802B of the roasting chamber 800 meet is generally be pointing directly downward. Inside the roasting chamber 800, beans 806 will generally gather in the depression defined between by and/or between the two sides 802A and 802B, which is the target area of the roasting chamber 800.

During use of the roasting chamber 800, the roasting chamber 800 is configured to rotate about an axis of rotation $A_{ROT}$ that is positioned at an angle relative to the horizontal axis $A_H$. In the illustrated implementation, the axis of rotation $A_{ROT}$ is positioned at about 45° relative to the horizontal axis $A_H$. However, in other implementations, the axis of rotation $A_{ROT}$ could be positioned at other angles relative to either the horizontal axis $A_H$ and/or the vertical axis $A_V$. Generally, the axis of rotation $A_{ROT}$ is not itself horizontal or vertical, and thus the roasting chamber 800 can be considered to be a tilted roasting chamber. However, in some implementations, a roasting chamber that is the same as or similar to the roasting chamber 800 can be used, except that the axis of rotation $A_{ROT}$ is horizontal or vertical. The roasting chamber 800 will generally include a number of inwardly-pointing fins (similar to fins 108 of roasting chamber 100) that carry the beans 806 as the roasting chamber 800 rotates. During rotation of the roasting chamber 800, the fins will carry the beans 806 upward, and the beans 806 will then eventually fall back down to the target area of the roasting chamber 800.

FIG. 11 also illustrates an optics arm 810 that extends through the opening 804 and can be used to direct electromagnetic radiation onto the target area of the roasting chamber 800. In the illustrated implementation, the opening 804 is wider than the width of the optics arm 810. However, in other implementations, the opening 804 may be only slight larger than the width of the optics arm 810, such that the roasting chamber 800 essentially has an additional side where the optics arm 810 enters the roasting chamber 800. In some implementations, the opening 804 may be where the beans 806 are loaded into the roasting chamber 800 prior to roasting, and/or unloaded from the roasting chamber 800 after roasting. In other implementations, the roasting chamber 800 may include an additional opening or openings where the beans can be loaded into and/or unloaded from the roasting chamber 800.

The optics arm 810 includes a housing 812 and a movable mirror 814 disposed within the housing 812. The optics arm 810 is configured to receive an incoming beam 818 of electromagnetic radiation that is generated using a laser or other source (not shown). The beam 818 of electromagnetic radiation is incident on the mirror 814, which reflects a beam 820 of electromagnetic radiation onto the target area of the roasting chamber 800. The optics arm 810 includes a window 816 defined in the housing 812, to allow the reflected beam 820 of electromagnetic radiation to pass through. The optics arm 810 may include additional imaging optics (such as a diverging lens) to ensure that the beam 818 of electromagnetic radiation has the desired characteristics when it is incident on the mirror 814.

The mirror 814 (which can be a mirror galvanometer) is configured to rotate through a range of motion, so that the beam 820 of electromagnetic radiation can be swept across the target area of the roasting chamber 800. In FIG. 11, the mirror 814 is shown in a first position. In the first position, the mirror 814 is angled with respect to the beam 818 of electromagnetic radiation, so that the beam 820 of electromagnetic radiation is incident on the target area closer to the end of side 802B of the roasting chamber. FIG. 11 also shows a dashed version 814' the movable mirror in the second position, and a dashed version 820' of the reflected electromagnetic radiation. The mirror 814' in the second position is angled with respect to the beam 818 of electromagnetic radiation so that the beam 820' of electromagnetic radiation is incident on the target area closer to the side 802A of the roasting chamber 800. Similar to other implementations disclosed herein, the mirror 814 can be repeatedly moved back and forth so that the beam 820 of electromagnetic radiation sweeps across the full width of the target area between the sides 802A and 802B of the roasting chamber 800. In some implementations, the width of the target area is the full width of the sides 802A and 802B. In other implementations, the width of the target area is a portion of the full width of the sides 802A and 802B.

While the illustrated implementation shows the optics arm 810 extending into the interior of the roasting chamber 800, other implementations of the roasting chamber 800 may not include the optics arm 810 as illustrated. For example, in some implementations, the optics arm 810 may terminate short of the opening 804, and the electromagnetic radiation from the optics arm 810 can itself pass through the opening 804. In some of these implementations, the roasting chamber 800 still includes imaging optics (such as the movable mirror 814 and/or other components) disposed therein that direct the electromagnetic radiation to the target area. In others of these implementations, the opening 804 is positioned relative to the target area such that the electromagnetic radiation that passes through the opening 804 will be incident on the target area without any additional imaging optics.

In further implementations, the roasting chamber 800 may not include the optics arm 810 at all. Instead, an electromagnetic radiation source (which could be a variety of different types of lasers, including a fiber laser) may be disposed outside or inside the roasting chamber 800. Electromagnetic radiation from the electromagnetic radiation source can be directed to the target area with or without the use of any imaging optics (such as the movable mirror).

The system can have one or more processing devices and one or more user input devices. The processing devices can control various aspects of the system, such as the optics used to shape and direct the laser beam, the rotation of the drum, etc. The user input devices can allow a user to manually adjust various parameters.

In some implementations, coffee beans prepared using the disclosed systems and methods undergo a specific molecular change when they are roasted and cooled/cured as described herein. Thus, preparing coffee beans (or other beans or objects) using the disclosed systems and methods can create a unique coffee beans unlike coffee beans prepared using other systems and methods. These coffee beans can have a unique taste and/or smell profile, owing at least in part to the molecular changed affected by the disclosed systems and methods. Further, coffee drinks or products (such as brewed coffee) made from coffee beans prepared using the disclosed systems and methods can have a unique taste and/or smell profile as well.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

While the present disclosure has been described with reference to one or more particular implementations, those skilled in the art will recognize that many changes may be made thereto without departing from the spirit and scope of the present disclosure. Each of these implementations and obvious variations thereof is contemplated as falling within the spirit and scope of the present disclosure. It is also contemplated that additional implementations according to aspects of the present disclosure may combine any number of features from any of the implementations described herein.

What is claimed is:

1. A system for heating an object, comprising:
   an electromagnetic radiation source configured to emit electromagnetic radiation;
   a first stage including a target area, at least a first portion of the electromagnetic radiation being directed toward the first stage, the first stage being configured to direct the object and first portion of the electromagnetic radiation to the target area such that at least some of the first portion of the electromagnetic radiation strikes the object to thereby heat the object and produce particulate matter;
   a second stage having a cooling fluid flowing therethrough such that the object received from the first stage moved through the second stage is cooled; and
   a third stage fluidly coupled to the first stage such that air and the particulate matter flow from the first stage to the third stage, at least a second portion of the electromagnetic radiation being directed to the third stage such that at least some of the second portion of the electromagnetic radiation is configured to strike the particulate matter to thereby incinerate at least some of the particulate matter, the third stage including a filter, the third stage being configured to direct the air in the third stage through the filter and out of a vent.

2. The system of claim 1, wherein the object is one or more coffee beans, and wherein the electromagnetic radiation striking the one or more coffee beans in the first stage is configured to roast the one or more coffee beans.

3. The system of claim 1, wherein the first stage is a roasting chamber having a rotatable housing configured to rotate about a rotational axis, the rotatable housing including a plurality of inwardly-extending fins circumferentially distributed about an inner surface of the rotatable housing, each of the plurality of fins extending inwardly from a respective point on the inner surface of the rotatable housing.

4. The system of claim 3, wherein each of the plurality of inwardly-extending fins is angled relative to a radial axis connecting (i) the rotational axis of the rotatable housing to (ii) the respective point on the inner surface of the rotatable housing.

5. The system of claim 4, wherein each of the plurality of inwardly-extending fins is configured to hold the object for a period of time as the rotatable housing rotates.

6. The system of claim 5, wherein gravity causes the object to move from a first one of the plurality of inwardly-extending fins to a second one of the plurality of inwardly-extending fins as the rotatable housing rotates.

7. The system of claim 3, wherein the object moves in a circumferential direction about a portion of the inner surface of the rotatable housing.

8. The system of claim 3, wherein the target area is a portion of the inner surface of the rotatable housing such that each of the plurality of inwardly-extending fins is periodically located within the target area as the rotatable housing rotates.

9. The system of claim 8, wherein the object is caused to move from each of the plurality of inwardly-extending fins to a subsequent one of the plurality of inwardly-extending fins as the rotatable housing rotates, such that the object is located within the target area of the rotatable housing.

10. The system of claim 8, wherein the first stage includes one or more optical components configured to direct the first portion of the electromagnetic radiation toward the target area such that at least some of the first portion of the electromagnetic radiation strikes the object when the object is located in the target area.

11. The system of claim 8, wherein the target area spans at least 25% of the inner surface of the rotatable housing.

12. The system of claim 3, wherein the first stage further includes an optics arm positioned along a rotational axis of the rotatable housing, the optics arm extending along the rotational axis of the rotatable housing and being configured to direct the first portion of the electromagnetic radiation toward at least some of the plurality of inwardly-extending fins circumferentially distributed along the inner surface of the rotatable housing.

13. The system of claim 12, wherein the optics arm is configured to direct the first portion of the electromagnetic radiation about a portion of the inner surface of the rotatable housing.

14. The system of claim 13, wherein the optics arm includes one or more optical components configured to direct the first portion of the electromagnetic radiation to the target area.

15. The system of claim 14, wherein the one or more optical components includes (i) two mirror galvanometers, (ii) four mirror galvanometers, (iii) two mirrors and two diverging lenses, (iv) two mirrors and one diverging lens, (v) one mirror galvanometer and one scanning lens, or (vi) any combination of mirrors, lenses, or mirror galvanometers.

16. The system of claim 1, wherein the first stage includes a plurality of sensors configured to monitor the object and detect when the object has been heated.

17. The system of claim 1, wherein the second stage is a screw conveyor including a rotating helical blade positioned within a housing, the rotating helical blade configured to move the object in a helical path from an entrance of the housing to an exit of the housing.

18. The system of claim 17, wherein the screw conveyor includes a fluid path through which the cooling fluid flows, the cooling fluid being configured to cool the object as the screw conveyor moves the object through the housing and the cooling fluid flows through the fluid path.

19. The system of claim 18, wherein the screw conveyer includes one or more pipes or tubes positioned within the housing that form the fluid path.

20. The system of claim 18, wherein the fluid path has a helical shape so as to generally match the helical path of the object.

21. The system of claim 18, wherein the cooling fluid is a refrigerant.

22. The system of claim 1, wherein the third stage includes an generally airtight housing, a least a portion of an interior of the housing being reflective such that the second portion of the electromagnetic radiation propagates within the housing and is trapped within the housing.

23. The system of claim 22, wherein air and particulate matter from the first stage is transported to the interior of the housing of the third stage, the second portion of the electromagnetic radiation propagating within the housing contacting the particulate matter to thereby incinerate at least a portion of the particulate matter.

24. The system of claim 23, wherein the third stage is configured to vent the air within the housing through a filter and out of the housing, subsequent to the incineration of the at least a portion of the particular matter.

25. The system of claim 23, wherein the particulate matter includes at least smoke or coffee bean chaff.

26. The system of claim 1, further comprising a photovoltaic power generation unit configured to (i) receive a portion of the electromagnetic radiation emitted by the electromagnetic radiation source and (ii) generate electrical power in response to receiving the portion of the electromagnetic radiation.

27. The system of claim 26, wherein the photovoltaic power generation unit includes a diverging lens, a semiconductor film, and a pair of electrical contacts electrically connected to the semiconductor film, the diverging lens being configured to direct the portion of the electromagnetic radiation onto the semiconductor film such that a voltage is formed between the pair of electrical contacts.

28. The system of claim 1, further comprising a cooling system fluidly coupled to the second stage, the cooling system being configured to provide the cooling fluid flowing through the second stage, the cooling fluid carried by a cooling pipe.

29. The system of claim 28, wherein the cooling system is an absorption cooler.

30. The system of claim 1, wherein the first stage includes a housing and an optics arm at least partially disposed within the housing, the housing being configured to contain the object as the first portion of the electromagnetic radiation strikes the object.

31. The system of claim 30, wherein the target area is at least a portion of an inner surface of the housing, and wherein the optics arm is configured to direct the first portion of the electromagnetic radiation onto the target area.

32. The system of claim 31, wherein the optics arm includes a housing, at least one mirror galvanometer disposed in the housing, and a window formed in the housing, the at least one mirror galvanometer being positioned to direct the first portion of the electromagnetic radiation through the window and onto the target area.

33. The system of claim 32, wherein the mirror galvanometer is configured to rotate through a range of motion to direct the first portion of the electromagnetic radiation to the target area.

34. The system of claim 33, wherein the mirror galvanometer is configured to move between a first end of the range of motion and a second end of the range of motion, the first portion of the electromagnetic radiation being directed to a first end of the target area when the mirror galvanometer is at the first end of the range of motion, the first portion of the electromagnetic radiation being directed to a first end of the target area when the mirror galvanometer is at the first end of the range of motion.

35. The system of claim 34, wherein in response to the mirror galvanometer moving between the first end of the range of motion and the second end of the range of motion, a portion of the target area to which the first portion of the electromagnetic radiation is directed moves between the first end of the target area and the second end of the target area.

36. The system of claim 1, wherein the object is configured caused to move through the system in a generally vertical direction, or a generally horizontal direction.

37. A system for heating an object, comprising:
- an electromagnetic radiation source configured to emit electromagnetic radiation;
- a roasting chamber configured to receive the object and at least a first portion of the electromagnetic radiation, and direct the first portion of the electromagnetic radiation toward the object such that at least some of the first portion of the electromagnetic radiation strikes the object to thereby heat the object and produce particulate matter;
- a cooling vessel configured to receive the object from the roasting chamber, and transport the object therethrough such that the object cools down; and
- an incineration vessel configured to receive air and the particulate matter from the roasting chamber, and a second portion of the electromagnetic radiation.

38. The system of claim 37, wherein the incineration vessel is configured to direct the second portion of the electromagnetic radiation toward the particulate matter to thereby incinerate at least a portion of the particulate matter.

39. A method of preparing coffee beans, the method performed by the system of claim 37 and comprising:
- placing one or more coffee beans into the roasting chamber, the roasting chamber including a rotatable housing having a plurality of inwardly-extending fins configured to carry the coffee beans as the rotatable housing rotates;
- irradiating, using the electromagnetic radiation source, (i) the coffee beans, (ii) an interior of the rotatable housing, or (iii) both (i) and (ii), while the rotatable housing rotates;
- subsequent to the irradiating, moving the coffee beans to the cooling vessel; and
- causing the coffee beans to move through the cooling vessel for a period of time to cool the coffee beans.

* * * * *